United States Patent
Chao et al.

(10) Patent No.: US 9,559,130 B2
(45) Date of Patent: Jan. 31, 2017

(54) DEPTH SENSING PIXEL, COMPOSITE PIXEL IMAGE SENSOR AND METHOD OF MAKING THE COMPOSITE PIXEL IMAGE SENSOR

(71) Applicant: TAIWAN SEMICONDUCTOR MANUFACTURING COMPANY, LTD., Hsinchu (TW)

(72) Inventors: Calvin Yi-Ping Chao, Zhubei (TW); Kuo-Yu Chou, Hsinchu (TW); Chih-Min Liu, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/238,078

(22) Filed: Aug. 16, 2016

(65) Prior Publication Data
US 2016/0358955 A1 Dec. 8, 2016

Related U.S. Application Data

(62) Division of application No. 14/534,892, filed on Nov. 6, 2014, now Pat. No. 9,437,633.

(51) Int. Cl.
*H01L 27/146* (2006.01)

(52) U.S. Cl.
CPC ....... *H01L 27/146* (2013.01); *H01L 27/14609* (2013.01)

(58) Field of Classification Search
CPC ............. H01L 27/146; H01L 27/14603; H01L 27/14609; H01L 27/14643; H01L 31/113
USPC .......................................................... 438/59
See application file for complete search history.

(56) References Cited

U.S. PATENT DOCUMENTS

| | | | |
|---|---|---|---|
| 2007/0131992 A1 | 6/2007 | Dosluoglu | |
| 2012/0175685 A1 | 7/2012 | Kim | |
| 2016/0043126 A1 | 2/2016 | Fan | |
| 2016/0088253 A1* | 3/2016 | Tezuka | H01L 27/14643 438/59 |
| 2016/0133664 A1* | 5/2016 | Aoki | H01L 27/14643 257/435 |

* cited by examiner

*Primary Examiner* — Cuong Q Nguyen
(74) *Attorney, Agent, or Firm* — Hauptman Ham, LLP

(57) ABSTRACT

A method of making a composite pixel image sensor includes forming an image sensing array; and forming a depth sensing pixel. The depth sensing pixel includes a depth sensing photodiode; a first photo storage diode; and a first transistor configured to selectively couple the depth sensing photodiode to the first photo storage diode. The depth sensing pixel further includes a second photo storage diode different from the first photo storage device; and a second transistor configured to selectively couple the depth sensing photodiode to the second photo storage device. The depth sensing pixel further includes a first transfer gate configured to selectively couple the first photo storage diode to a first output node. The depth sensing pixel further includes a second transfer gate configured to selectively couple the second photo storage diode to a second output node. The method includes bonding the image sensing array to the depth sensing pixel.

20 Claims, 17 Drawing Sheets

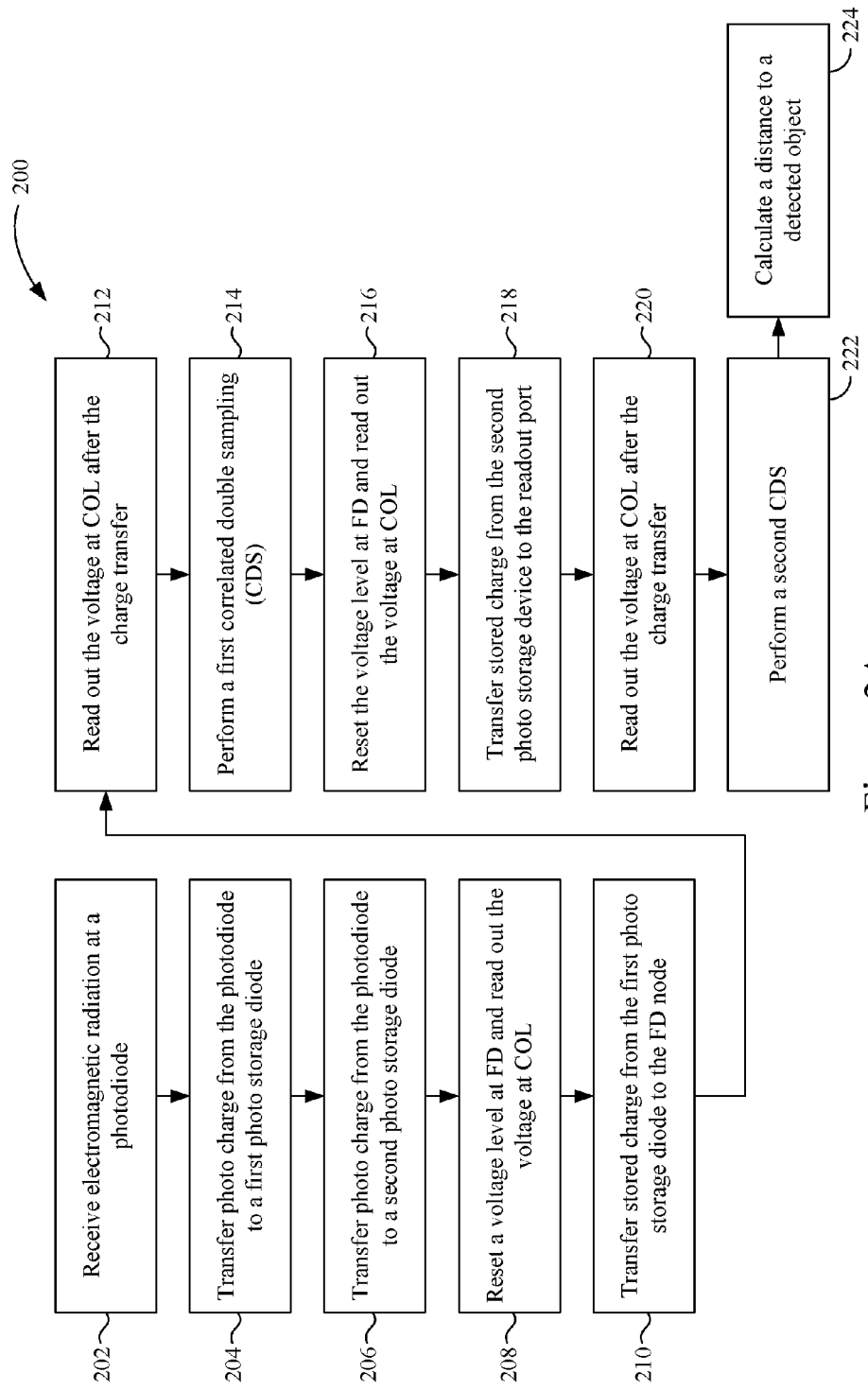

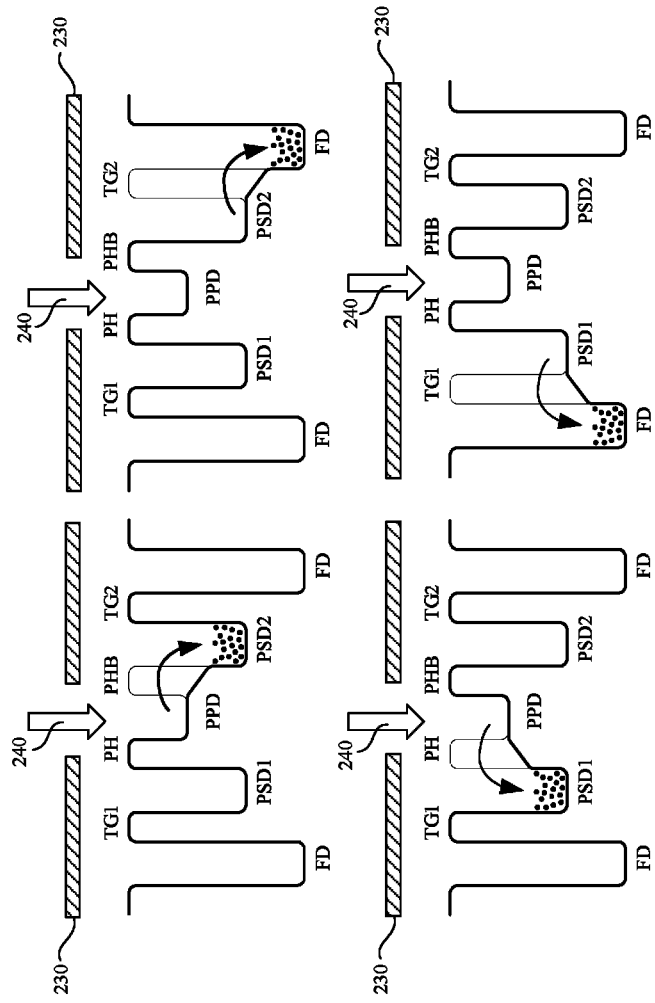

DEPTH SENSING PIXEL, COMPOSITE PIXEL IMAGE SENSOR AND METHOD OF MAKING THE COMPOSITE PIXEL IMAGE SENSOR

PRIORITY CLAIM

The present application is a divisional of U.S. application Ser. No. 14/534,892, filed Nov. 6, 2014, which is incorporated herein by reference in its entirety.

BACKGROUND

A depth sensing pixel is used to determine a distance between an image sensor and an object. An image sensing pixel is used to capture an image of the object. A composite pixel includes a depth sensing pixel combined with an image sensing pixel to determine a distance to the object and capture an image of the object.

In a structure including both the image sensing pixel and the depth sensing pixel, the outputs of the depth sensing pixel and the image sensing pixels are output using a time multiplexing strategy, in some approaches. The time multiplexing strategy allocates one frame to the depth sensing pixel and one frame to the image sensing pixel in an alternating manner.

In approaches where the depth sensing pixel is positioned behind the image sensing pixel so that incident light passes through the image sensing pixel to reach the depth sensing pixel, formation of the depth sensing pixel depends on the precision of the fabrication tools. In some approaches, the depth sensing pixel is located in a non-overlapping position with the image sensing pixel. In some approaches, the depth sensing pixel is located around a periphery of the image sensing pixel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a flowchart of a method of using a depth sensing pixel in accordance with some embodiments.

FIGS. 2B-2E are diagrams of charge transfer during various stages of the method in FIG. 2A in accordance with some embodiments.

DETAILED DESCRIPTION

Figure 1:
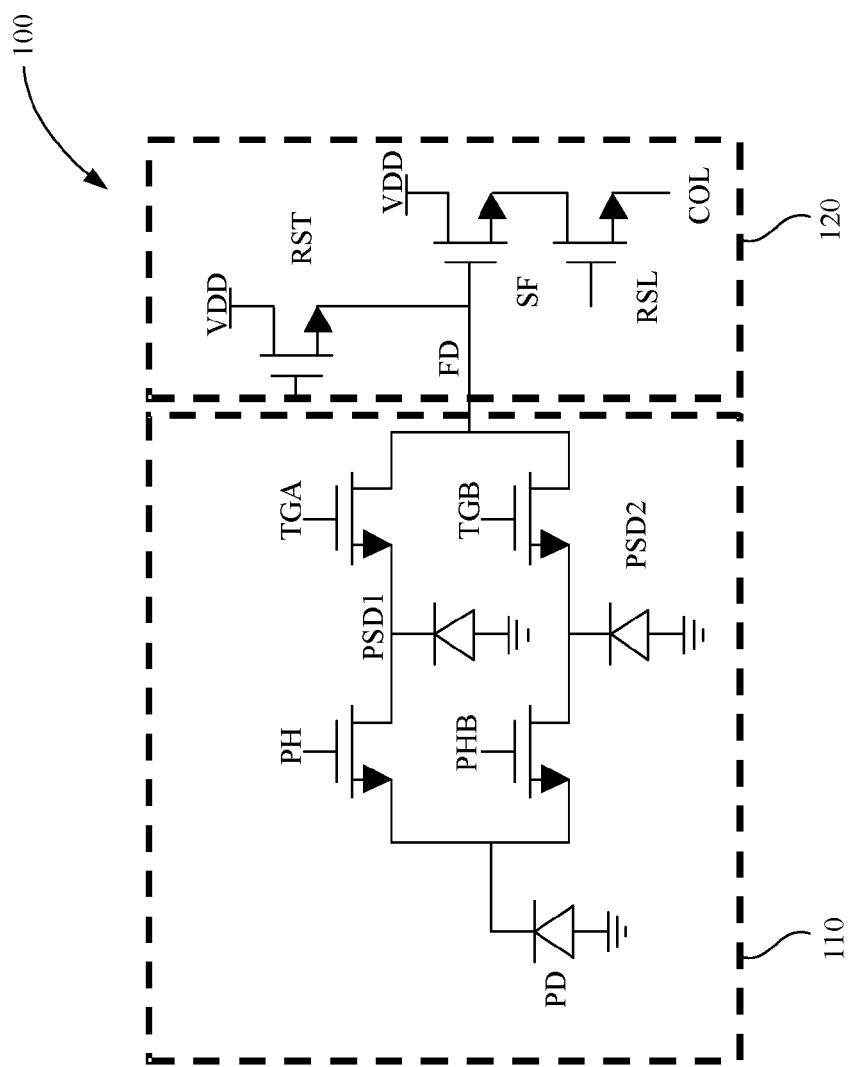
FIG. 1 is a schematic diagram of a depth sensing pixel in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a depth sensing pixel 100 in accordance with some embodiments. Depth sensing pixel 100 includes a sensing circuit 110 configured to detect electromagnetic radiation. A readout circuit 120 is coupled to sensing circuit 110. Readout circuit 120 is configured to transfer a signal from sensing circuit 110 to external circuits.

Sensing circuit 110 is configured to detect electromagnetic radiation reflected by an object. In some embodiments, the electromagnetic radiation reflected by the object is generated by a light source (not shown) coupled to depth sensing pixel 100. Sensing circuit 110 includes a photodiode (PD) which is sensitive to electromagnetic radiation. Photodiode PD is coupled to a transistor PH and to a transistor PHB. A gate of transistor PH is configured to receive a signal which is complementary with respect to a signal received by a gate of transistor PHB. In some embodiments, the gate of transistor PH is configured to receive a signal which is in phase with a pulse from the light source. Sensing circuit 110 further includes a first photo storage diode PSD1 coupled to an opposite side of transistor PH from photodiode PD. A second photo storage diode PSD2 is coupled to an opposite side of transistor PHB from photodiode PD. Sensing circuit 110 further includes a first transfer gate TGA configured to selectively couple first photo storage diode PSD1 with readout circuit 120. A second transfer gate TGB is configured to selectively couple second photo storage diode PSD2 with readout circuit 120.

Readout circuit 120 is configured to transfer an output from sensing circuit 110 to downstream circuits such as amplifiers or analog-to-digital (AD) converters. A node FD is located between readout circuit 120 and sensing circuit 110. Node FD is also known as a floating diffusion node, in some embodiments. Readout circuit 120 includes a reset transistor RST configured to selectively couple FD node to a supply voltage VCC to pull-high the FD node before the stored photo charges are transferred to the FD node by turning on the transfer gates TGA or TGB. A gate of a source follower SF is coupled to node FD. A row select transistor RSL is coupled between source follower SF and the external circuits. In some embodiments, the external circuit is a constant current source. When the row select transistor RSL is turned on during the readout time, the source follower SF is activated and coupled to the external circuits. When the row select transistor is turned off during the integration time and the idle time, the source follower is deactivated and isolated from the external circuits. After the photo charges are transferred from the photo storage diode PSD to the FD node, the voltage of the FD node decreases proportionally to the amount of photo charges transferred. The downstream readout circuits samples the FD node voltage before the charge transfer, and after the charge transfer; amplify the difference between the first sampling and the second sampling; and perform the AD conversion. The above described process is commonly referred to as the correlated double sampling, or the CDS. Since the KTC noise, or the reset noise, are the same (correlated) during the first sampling and the second sampling, KTC noise are reduced or eliminated by subtraction either in analog circuits or in digital circuits. KTC noise is associated with the diffusion junction capacitance of the FD node, the gate capacitance of the SF transistor, and the parasitic capacitance between the FD node and various metal layers, vias, and contacts.

Photodiode PD is configured to receive electromagnetic radiation and convert the electromagnetic radiation into an electrical charge. In some embodiments, a waveband of the electromagnetic radiation is near infrared (NIR) radiation, e.g., about 780 nanometers (nm) to about 2,500 nm. In some embodiments, photodiode PD is a pinned photodiode. A pinned photodiode is a pn-junction diode with a shallow and heavily-doped pinning layer to pin the diode surface potential to substrate to create a specific potential profile such that a complete charge transfer from the pinned photodiode to the photo storage diode is possible when the transfer gate is biased higher than a pinning voltage. In some embodiments, photodiode PD is configured to receive the electromagnetic radiation through an interconnect structure, i.e., the photodiode is part of a front-side illuminated (FSI) image sensor. In some embodiments, photodiode PD is configured to receive the electromagnetic radiation without the electromagnetic radiation propagating through an interconnect structure, i.e., the photodiode is part of a back-side illuminated (BSI) image sensor.

Transistor PH is configured to selectively couple photodiode PD to first photo storage diode PSD1. A conductivity of transistor PH is determined based on a signal applied to the gate of the transistor. In some embodiments, the signal applied to the gate of transistor PH is generated by a clock circuit (not shown). In some embodiments, the clock circuit is also usable to control a light source for emitting electromagnetic radiation toward an object detected by depth sensing pixel 100. In some embodiments, transistor PH is controlled to be conductive while the light source is emitting the electromagnetic radiation, i.e., the transistor is in-phase with the light source. In some embodiments, transistor PH is not in-phase with the light source. In some embodiments, transistor PH is a metal-oxide-semiconductor (MOS) transistor. In some embodiments, transistor PH is a high electron mobility transistor (HEMT), a bi-polar junction transistor (BJT), a fin field-effect-transistor (FinFET), or another suitable transistor. In some embodiments, photodiode PD is coupled to a drain of transistor PH. In some embodiments, photodiode PD is coupled to a source of transistor PH.

Transistor PHB is configured to selectively couple photodiode PD to second photo storage diode PSD2. A conductivity of transistor PHB is determined based on a signal applied to the gate of the transistor. In some embodiments, the signal applied to the gate of transistor PHB is generated by the clock circuit. In some embodiments, transistor PHB is controlled to be conductive while the light source is not emitting the electromagnetic radiation, i.e., the transistor is out of phase with the light source. In some embodiments, transistor PHB is in-phase with the light source. In some embodiments, transistor PHB is a MOS transistor. In some embodiments, transistor PHB is an HEMT, a BJT, a FinFET, or another suitable transistor. In some embodiments, transistor PHB is a same transistor type as transistor PH. In some embodiments, transistor PHB is a different transistor type from transistor PH. In some embodiments, photodiode PD is coupled to a drain of transistor PHB. In some embodiments, photodiode PD is coupled to a source of transistor PHB.

First photo storage diode PSD1 is configured to receive a charge from photodiode PD through transistor PH. First photo storage diode PSD1 is capable of storing a greater charge than photodiode PD. In some embodiments, a storage capacity of the first photo storage diode is sufficient to help with transferring all charge from the photodiode during a conductive state of transistor PH. Transferring all charge from photodiode PD to first photo storage diode PSD1 helps to avoid signal loss during detection of incident electromagnetic radiation. In some embodiments, photo storage diode PSD1 is configured to store charges received from photodiode PD which are in-phase with light transmitted from the light source.

Second photo storage diode PSD2 is configured to receive a charge from photodiode PD through transistor PHB. Second photo storage diode PSD2 is capable of storing a greater charge than photodiode PD. In some embodiments, a storage capacity of the second photo storage diode is sufficient to help with transferring all charge from the photodiode during a conductive state of transistor PHB. Transferring all charge from photodiode PD to second photo storage diode PSD2 helps to avoid signal loss during detection of incident electromagnetic radiation. In some embodiments, a storage capacity of second photo storage diode PSD2 is equal to a storage capacity of first photo storage diode PSD1. In some embodiments, the storage capacity of second photo storage diode PSD2 is different from the storage capacity of first photo storage diode PSD1. In some embodiments, photo storage diode PSD2 is configured to store charges received from photodiode PD which are out-of-phase with light transmitted from the light source.

In a depth sensing operation, the received light reflected from an object and the transmitted light has a phase difference, which is proportional to a distance between the light source and the object to be detected. A delay between the received reflected light and the transmitted light is commonly referred to as the time of flight. Some of the photo charges captured by photodiode PD are generated in-phase with the transmitted light of the light source, and some of the photo charges are generated out-of-phase with the transmitted light of the light source. In some embodiments, transistor PH is controlled by a pulse train in-phase with the light source such that the in-phase photo charges are collected by the photo storage diode PSD1, and transistor PHB is controlled by a pulse train out-of-phase with the light source such that the out-of-phase charges are collected by the photo storage diode PSD2. The difference between the in-phase photo charges and the out-of-phase photo charges is proportional to the distance, or the depth, of the object to be detected. The purpose of transistor PH and transistor PHB is to separate the in-phase and out-of-phase charges into photo storage diode PSD1 and photo storage diode PSD2, respectively. The stored charges on photo storage diode PSD1 and photo storage diode PSD2 are to be read out by the CDS operation after a programmed amount of integration time, either sequentially through a common single readout port, or in parallel through two separate readout ports. The results of the two readouts are then processed by analog or digital circuits to extract the depth information.

First transfer gate TGA is configured to transfer the charge from first photo storage diode PSD1 to node FD in response to a control signal. In some embodiments, the control signal applied to the gate of first transfer gate TGA is generated by the clock circuit, a driver, a selection circuit or another suitable control device. In some embodiments, the control signal is temporally offset with respect to the signal applied to the gate of transistor PH. In some embodiments, the control signal is substantially in-phase with the signal applied to the gate of transistor PHB. In some embodiments, first transfer gate TGA is a MOS transistor. In some embodiments, first transfer gate TGA is an HEMT, a BJT, a FinFET, or another suitable transfer device. In some embodiments, first photo storage diode PSD1 is coupled to a drain of first transfer gate TGA. In some embodiments, first photo storage diode PSD1 is coupled to a source of first transfer gate TGA.

Second transfer gate TGB is configured to transfer the charge from second photo storage diode PSD2 to node FD in response to a control signal. In some embodiments, the control signal applied to the gate of second transfer gate TGB is generated by the clock circuit, the driver, the selection circuit or another suitable control device. In some embodiments, the control signal is temporally offset with respect to the signal applied to the gate of transistor PHB. In some embodiments, the control signal is substantially in-phase with the signal applied to the gate of transistor PH. In some embodiments, second transfer gate TGB is a MOS transistor. In some embodiments, second transfer gate TGB is an HEMT, a BJT, a FinFET, or another suitable transfer device. In some embodiments, second transfer gate TGB is a same type of device as first transfer gate TGA. In some embodiments, second transfer gate TGB is a different type of device from first transfer gate TGB. In some embodiments, second photo storage diode PSD2 is coupled to a drain of second transfer gate TGB. In some embodiments, second photo storage diode PSD2 is coupled to a source of second transfer gate TGB. Node FD is connected to an output of sensing circuit 110 and an input of readout circuit 120 through the column bus COL. When a pixel is selected by activating the RSL transistor, the voltage at the column bus COL after the source follower SF follows proportionally to the FD voltage before the source follower SF. The downstream readout circuit samples the voltage of COL before and after the charge transfer, and the difference between two sampling is proportional to the FD node voltage difference, and therefore proportional to the charge transferred. A storage capacity of node FD is greater than the storage capacity of first photo storage diode PSD1 and the storage capacity of second photo storage diode PSD2 to help transfer charge to the node through first transfer gate TGA or second transfer gate TGB.

Reset transistor RST is configured to return the voltage level of node FD to the supply voltage in the case of the hard-reset, or one threshold-voltage below the supply voltage in the case of the soft-reset, before or after reading out the charge from sensing circuit 110. In some embodiments, reset transistor RST is between node FD and a reference voltage, and the reset transistor is configured to return the voltage level of the node to the reference voltage. A conductivity of reset transistor RST is determined based on a reset signal applied to a gate of the reset transistor. In some embodiments, the reset signal is generated by the clock circuit, or another suitable controlling device. In some embodiments, reset transistor RST is a MOS transistor. In some embodiments, reset transistor RST is an HEMT, a BJT, a FinFET, or another suitable transistor.

Source follower SF includes a gate coupled to the node FD. The voltage level at node FD determines a conductivity of source follower SF. In some embodiments, source follower SF is in a non-conductive state following the reset of node FD to the supply voltage. In some embodiments, source follower SF is in a saturated state following the reset of node FD to the supply voltage. In some embodiments, source follower SF is a MOS transistor. In some embodiments, source follower SF is an HEMT, a BJT, a FinFET, or another suitable transistor. In some embodiments, source follower SF is a same transistor type as reset transistor RST. In some embodiments, source follower SF is a different type of transistor from reset transistor RST.

Row select transistor RSL is coupled to source follower SF and a voltage between the row select transistor and the source follower is determined based on a conductivity of the source follower. The voltage between row select transistor RSL and source follower SF is transferred to external circuit upon activation of the row select transistor. A gate of row select transistor RSL is configured to receive a row selection signal. In some embodiments, the row selection signal is generated by the clock circuit, a driver, a selection circuit or another suitable controlling device. In some embodiments, row select transistor RSL is a MOS transistor. In some embodiments, row select transistor RSL is an HEMT, a BJT, a FinFET, or another suitable transistor. In some embodiments, row select transistor RSL is a same transistor type as at least one of reset transistor RST or source follower SF. In some embodiments, row select transistor RSL is a different type of transistor from at least one of reset transistor RST or source follower SF.

In some comparison with other approaches, depth sensing circuit 100 includes a single readout port, where both of the in-phase charges stored on PSD1 and the out-of-phase charges stored on PSD2 are read out through the shared FD node and operated by the shared readout port including the RST, SF, and RSL devices. The single readout port reduces an overall size of depth sensing circuit 100 in comparison with other approaches which include multiple readout ports. Depth sensing circuit 100 also reduces mismatches, such as a mismatch resulting from the threshold voltages of reset transistor RST and source follower SF, in comparison with other approaches by providing both in-phase and out-of-phase readout along a same signal chain.

FIG. 2A is a flowchart of a method 200 of using a depth sensing pixel in accordance with some embodiments. Method 200 begins with receiving electromagnetic radiation at a photodiode in operation 202. In some embodiments, the electromagnetic radiation is NIR radiation. The photodiode converts the received electromagnetic radiation into an electrical charge. In some embodiments, the electrical charge resulting from the received electromagnetic radiation is called a photo charge. In some embodiments, the photodiode is part of a front-side illuminated image sensor. In some embodiments, the photodiode is part of a back-side illuminated image sensor. In some embodiments, the photodiode is photodiode PD (FIG. 1).

In operation 204, the photo charge is transferred from the photodiode to a first photo storage diode. A storage capacity of the first photo storage diode is greater than a storage capacity of the photodiode. In some embodiments, a storage capacity of the first photo storage diode is sufficient to help completely transfer photo charge from the photodiode to the first photo storage diode. In some embodiments, the photo charge is transferred during a time domain which is in-phase with operation of a light source associated with the depth sensing pixel. In some embodiments, the photo charge is transferred during a time domain which is out of phase with operation of the light source associated with the depth sensing pixel. In some embodiments, the first photo storage diode is first photo storage diode PSD1 (FIG. 1) or second photo storage diode PSD2. In some embodiments, the photo charge is transferred using transistor PH or transistor PHB.

FIG. 2B is a diagram of charge transfer during operation 204 in accordance with some embodiments. FIG. 2B includes a light shield 230 configured to limit propagation of an incident light beam 240 to the photodiode PPD. FIG. 2B indicates a transfer of charge from photodiode PPD to second photo storage diode PSD2. A depth of second photo storage diode PSD2 is greater than a depth of photodiode PPD to illustrate the increased storage capacity of second photo storage diode PSD2 in relation to photodiode PPD. In some embodiments, charge from photodiode PPD is transferred to first photo storage diode PSD1 instead of second photo storage diode PSD2.

In operation 206, a photo charge is transferred from the photodiode to a second photo storage diode. The photo charge transferred from the photodiode to the second photo storage diode is different from the photo charge transferred to the first photo storage diode. The photo charge transferred from the photodiode to the second photo storage diode is collected by the photodiode in a sequential manner with respect to the photo charge transferred to the first photo storage device. A storage capacity of the second photo storage diode is greater than a storage capacity of the photodiode. In some embodiments, a storage capacity of the second photo storage diode is sufficient to help completely transfer photo charge from the photodiode to the second photo storage diode. In some embodiments, the photo charge is transferred during a time domain which is in-phase with operation of the light source associated with the depth sensing pixel. In some embodiments, the photo charge is transferred during a time domain which is out of phase with operation of the light source associated with the depth sensing pixel. In some embodiments, the second photo storage diode is first photo storage diode PSD1 (FIG. 1) or second photo storage diode PSD2. In some embodiments, the photo charge is transferred using transistor PH or transistor PHB.

FIG. 2C is a diagram of charge transfer during operation 206 in accordance with some embodiments. FIG. 2C indicates a transfer of charge from photodiode PPD to first photo storage diode PSD1. A depth of first photo storage diode PSD1 is greater than a depth of photodiode PPD to illustrate the increased storage capacity of first photo storage diode PSD1 in relation to photodiode PPD. In some embodiments where charge is transferred from photodiode PPD to first photo storage diode PSD1 in operation 204, charge from photodiode PPD is transferred to second photo storage diode PSD2 instead of first photo storage diode PSD1 in operation 206.

A voltage level of a FD node and column bus COL is reset in operation 208. The voltage level of the FD node is reset by selectively coupling the FD node to a supply voltage or a reference voltage. In some embodiments, the voltage level of the FD node is reset using a reset transistor, e.g., reset transistor RST (FIG. 1). In some embodiments, the readout voltage on column bus COL, which follows the voltage of FD node, is reset using the reset transistor and a row select transistor, e.g., row select transistor RSL. A readout circuit samples the column bus COL voltage after the FD reset.

In operation 210, the charged stored in the first photo storage diode is transferred to the FD node. A storage capacity of the FD node is greater than the storage capacity of the first photo storage device. In some embodiments, a storage capacity of the readout node is sufficient to help completely transfer the photo charge from the first photo storage diode to the FD node. In some embodiments, the stored charge is transferred using first transfer gate TGA (FIG. 1) or second transfer gate TGB.

FIG. 2D is a diagram of charge transfer during operation 210 in accordance with some embodiments. FIG. 2D indicates a transfer of charge from second photo storage diode PSD2 to the FD node. A depth of the FD node is greater than a depth of second photo storage diode PSD2 to illustrate the increased storage capacity of the FD node in relation to second photo storage diode PSD2. In some embodiments where charge is transferred from photodiode PPD to first photo storage diode PSD1 in operation 204, charge from first photo storage diode PSD1 is transferred to the FD node in operation 210.

The voltage at the column bus COL is read out in operation 212. The voltage at the column bus COL is read out to external circuits. In some embodiments, the voltage at the FD node is read out using a source follower, e.g., source follower SF (FIG. 1), and a row select transistor, e.g., row select transistor RSL.

In operation 214, a first correlated double sampling (CDS) is performed on the two voltages read out from the readout node at operations 208 and 212. CDS is a method used to measure electrical values that reduces undesired offset. The output, e.g., the voltage read out from the column bus COL, is measured twice, once with a known reset condition before the charge transfer and once with an unknown, signal-dependent condition after the charge transfer. A difference between the measured value with the known condition and the measured value with the unknown condition is used to reduce noise and offset within the measurement. In some embodiments, the noise is the KTC noise or the reset noise, and the offset could be the threshold voltage variation of the reset transistor RST and source follower SF. The first CDS is performed by the external circuits. In some embodiments, the known condition is the voltage level of the readout node following operation 208.

A voltage level of a FD node and the column bus COL is reset in operation 216. The voltage level of the FD node is reset by selectively coupling the readout node to a supply voltage or a reference voltage. In some embodiments, the voltage level of the FD node is reset using a reset transistor, e.g., reset transistor RST (FIG. 1). In some embodiments, the readout voltage on column bus COL, which follows the voltage of FD node, is reset using the reset transistor and a row select transistor, e.g., row select transistor RSL. A readout circuit samples the column bus COL voltage after the FD reset.

In operation 218, the charge stored in the second photo storage diode is transferred to the FD node. A storage capacity of the readout node is greater than the storage capacity of the second photo storage device. In some embodiments, a storage capacity of the readout node is sufficient to help completely transfer the photo charge from the second photo storage diode to the FD node. In some embodiments, the stored charge is transferred using first transfer gate TGA (FIG. 1) or second transfer gate TGB.

FIG. 2E is a diagram of charge transfer during operation 218 in accordance with some embodiments. FIG. 2E indicates a transfer of charge from first photo storage diode PSD1 to the FD node. A depth of the FD node is greater than a depth of first photo storage diode PSD1 to illustrate the increased storage capacity of the FD node in relation to first photo storage diode PSD1. In some embodiments where charge is transferred from photodiode PPD to first photo storage diode PSD1 in operation 204, charge from second photo storage diode PSD2 is transferred to the FD node in operation 218.

The voltage at the readout node is read out in operation 220. The voltage at the readout node is read out to external circuits. In some embodiments, the charge at the readout node is read out using a source follower, e.g., source follower SF (FIG. 1), and a row select transistor, e.g., row select transistor RSL.

In operation 222, a second CDS is performed on the charge read out from the readout node. The second CDS is performed by the external circuits. In some embodiments, the second CDS is performed using a same circuit as the first CDS. In some embodiments, the second CDS is performed using a different circuit from the first CDS.

A distance to a detected objected is calculated in operation 224. The distance to the detected object is calculated based on results of the first CDS from operation 214 and results of the second CDS from operation 222. In some embodiments, the distance to the detected object is calculated using external circuitry such as analog circuits or digital circuits. In some embodiments, a distance to multiple detected objects is calculated in operation 224.

In some embodiments, an order of the operations of method 200 is altered. In some embodiments, at least one operation of method 200 is combined with at least another operation of the method. In some embodiments, additional operations are included in method 200. In some embodiments, the floating-diffusion node FD, the photo storage nodes PSD1 and PSD2 are shielded from the incident light by one or a combination of multiple metal layers such that the photo carriers are only generated in the pinned photo diode PPD, not in FD, PSD1, or PSD2. FIGS. 2-1, 2-2, 2-3, and 2-4 are simplified electronic potential profiles corresponding to the operations 204, 206, 210, and 218, respectively, where the metal shield 230 prevents the generation of photo carriers in FD, PSD1, and PSD2.

Figure 3:
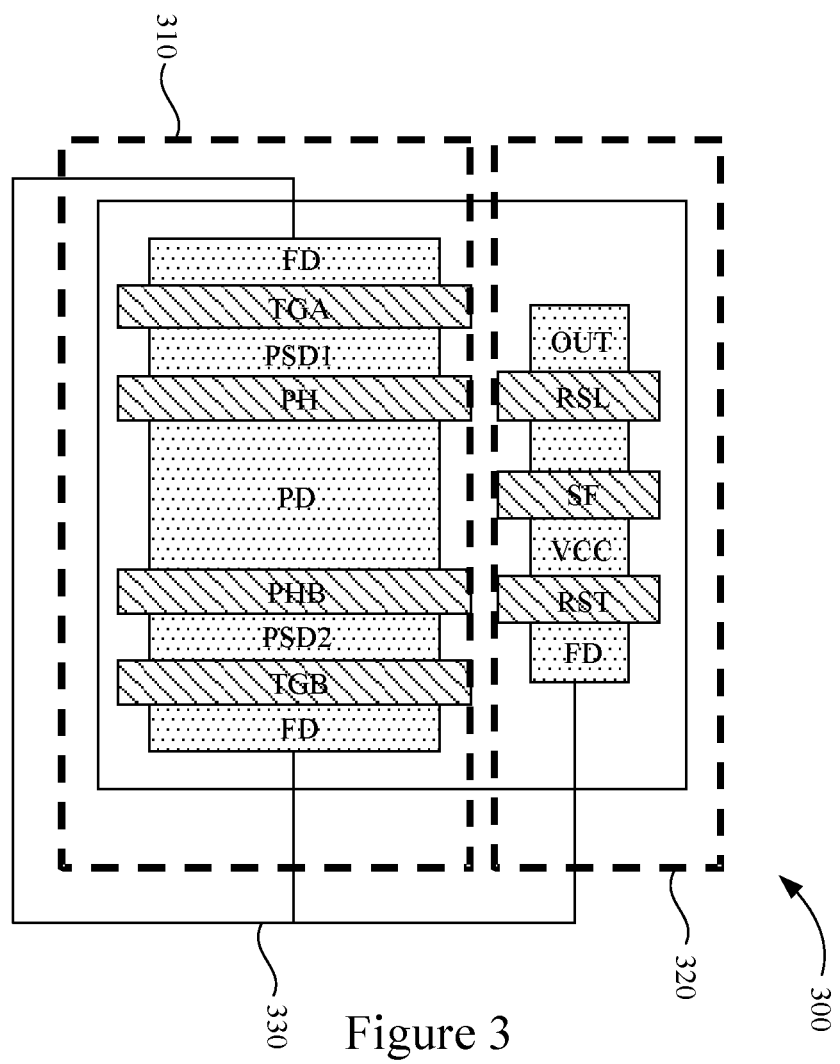
FIG. 3 is a top view of a layout of a depth sensing pixel in accordance with some embodiments.

FIG. 3 is a top view of a layout 300 of a depth sensing pixel in accordance with some embodiments. Layout 300 includes a sensing circuit layout 310 and a readout circuit layout 320. Elements in sensing circuit layout 310 are to the same as elements in sensing circuit 110 (FIG. 1) and have a same reference character. Elements in readout circuit layout 320 the same as elements in readout circuit 120 and have a same reference character. Node FD in sensing circuit layout 310 is coupled to node FD in readout circuit layout 320 by an interconnect structure 330.

Photodiode PD is configured to receive electromagnetic radiation and convert the received electromagnetic radiation to an electrical charge. The electrical charge is then able to be transferred to first photo storage diode PSD1 across transistor PH, or to second photo storage diode PSD2 across transistor PHB. The electrical charge stored in first photo storage diode PSD1 is transferable to node FD across first transfer gate TGA. The electrical charge stored in second photo storage diode PSD2 is transferable to node FD across second transfer gate TGB.

Node FD of sensing circuit layout 310 is coupled to node FD of readout circuit layout 320 by interconnect structure 330. Reset transistor RST is usable to reset the voltage level of node FD to a supply voltage VCC. Node FD is coupled to source follower SF by the interconnect structure. Based on a voltage level of node FD, supply voltage VCC is transferable to the node between source follower SF and row select transistor RSL. In some embodiments, the supply voltage is a VDD voltage. Row select transistor RSL is able to be activated based on a row select signal provided through the interconnect structure. The voltage level between source follower SF and row select transistor RSL is transferable to an output OUT based on the voltage level of the row select signal.

Readout circuit layout 320 is spaced from sensing circuit layout 310. In some embodiments, readout circuit layout 320 is contiguous with readout circuit layout 310. In some embodiments, nodes FD on opposite sides of sensing circuit layout 310 are coupled together by the interconnect structure. In some embodiments, nodes FD on opposite sides of sensing circuit layout 310 are separately coupled to node FD of readout circuit layout 320.

Figure 4:
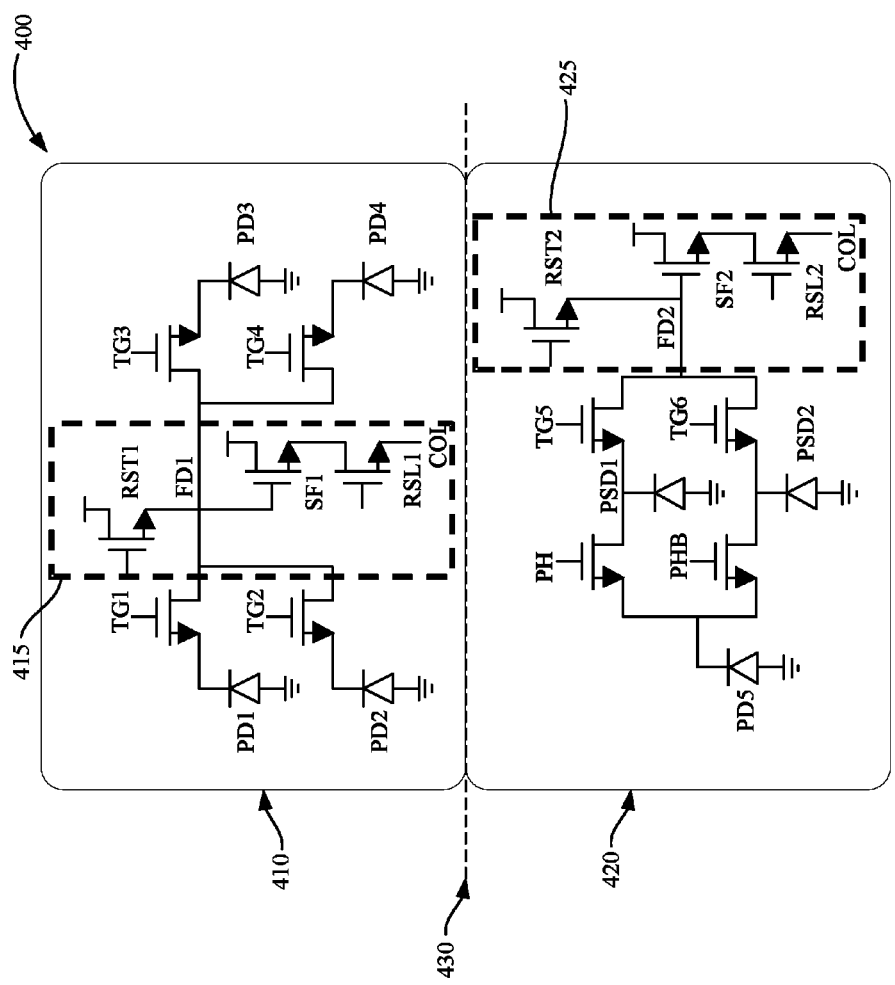
FIG. 4 is a schematic diagram of a composite pixel image sensor in accordance with some embodiments.

FIG. 4 is a schematic diagram of a composite pixel image sensor 400 in accordance with some embodiments. Composite pixel image sensor 400 includes an image sensing array 410 bonded to a depth sensing pixel 420 at a bonding interface 430. Image sensing array 410 is configured to detect electromagnetic radiation from an object where the radiation is in a first spectrum. Depth sensing pixel 420 is configured to detect electromagnetic radiation from the object where the radiation is in a second spectrum different from the first spectrum. Image sensing array 410 is bonded to depth sensing pixel 420 at bonding interface 430 to form an integrated structure. Incoming electromagnetic radiation propagates through image sensing array 410 to reach depth sensing pixel 420.

Image sensing array 410 is used to detect electromagnetic radiation from the object in the first spectrum. In some embodiments, the first spectrum is a visible spectrum, e.g., having a waveband from about 390 nm to about 700 nm. Image sensing array 410 includes a plurality of photodiodes PD1, PD2, PD3 and PD4. A first transfer gate TG1 couples first photo diode PD1 to a readout circuit 415. A second transfer gate TG2 couples second photo diode PD2 to readout circuit 415. A third photodiode PD3 is coupled to readout circuit 415 by a third transfer gate TG3. A fourth photodiode PD4 is coupled to readout circuit 415 by a fourth transfer gate TG4. Readout circuit 415 is configured to read out the FD1 voltages before and after each charge transfer from PD1, PD2, PD3, PD4 to FD1 separately. Readout circuit 415 includes elements which are the same as readout circuit 120 (FIG. 1) and the same elements have a same reference character with the number "1" appended.

In some embodiments, at least one photodiode of the plurality of photodiodes PD1, PD2, PD3 or PD4 is a pinned photodiode. In some embodiments, at least one photodiode of the plurality of photodiodes PD1, PD2, PD3 or PD4 is configured to detect a different wavelength from at least another of the plurality of photodiodes PD1, PD2, PD3 or PD4. In some embodiments, at least one photodiode of the plurality of photodiodes PD1, PD2, PD3 or PD4 is configured to detect a same wavelength from at least another of the plurality of photodiodes PD1, PD2, PD3 or PD4, by coating different color filters on top of them. In some embodiments, a first photodiode PD1 is configured to detect electromagnetic radiation in a green spectrum, e.g., having a waveband from about 495 nm to about 570 nm. In some embodiments, a second photodiode PD2 is configured to detect electromagnetic radiation in a red spectrum, e.g., having a waveband from about 620 nm to about 700 nm. In some embodiments, a third photodiode PD3 is configured to detect electromagnetic radiation in a blue spectrum, e.g., having a waveband from about 450 nm to about 495 nm. In some embodiments, a fourth photodiode PD4 is configured to detect electromagnetic radiation in a green spectrum, e.g., having a waveband from about 495 nm to about 570 nm.

In some embodiments, image sensing array 410 is arranged as a back-side illuminated image sensor so that an interconnect structure (not shown) is between the plurality of photodiodes PD1, PD2, PD3 and PD4 and depth sensing pixel 420. In some embodiments, image sensing array 410 is arranged as a front-side illuminated image sensor so that the interconnect structure is on a side of the plurality of photodiodes PD1, PD2, PD3 and PD4 opposite depth sensing pixel 420.

Depth sensing circuit 420 is similar to depth sensing circuit 100 (FIG. 1). In comparison with depth sensing circuit 100, a photodiode, corresponding to photodiode PD, of depth sensing circuit 420 is labeled PD5. In comparison with depth sensing circuit 100, a first transfer gate, corresponding to first transfer gate TGA, of depth sensing circuit 420 is labeled TG5. In comparison with depth sensing circuit 100, a second transfer gate, corresponding to second transfer gate TGB, of depth sensing circuit 420 is labeled TG6. Depth sensing circuit 420 includes a readout circuit 425 which corresponds to readout circuit 120 and the same elements have a same reference character with the number "2" appended.

In some embodiments, depth sensing pixel 420 is arranged as a front-side illuminated image sensor so that an interconnect structure (not shown) is between photodiode PD5 and image sensing array 410. In some embodiments, depth sensing pixel 420 is arranged as a back-side illuminated image sensor so that the interconnect structure is on a side of photodiode PD5 opposite image sensing array 410.

Bonding interface 430 is a location where image sensing array 410 is bonded to depth sensing pixel 420. In some embodiments, bonding interface 430 includes a fusion bond between image sensing array 410 and depth sensing pixel 420. In some embodiments, the fusion bond includes a silicon-silicon oxide bond, a silicon oxide-silicon oxide bond, a silicon-silicon bond, or another suitable fusion bond.

In some embodiments, a metallic material is formed on at least one of image sensing array 410 or depth sensing pixel 420. In some embodiments, bonding interface includes a eutectic bond. In some embodiments, the eutectic bond includes a silicon-metallic bond, a metallic-metallic bond, a silicon oxide-metallic bond, or another suitable eutectic bond.

Composite pixel image sensor 400 includes four photodiodes PD1, PD2, PD3 and PD4 in image sensing array 410; and one photodiode PD5 in depth sensing pixel 420. In some embodiments, a different number of photodiodes is included in at least one of image sensing array 410 or depth sensing pixel 420.

In operation, composite pixel image sensor 400 receives electromagnetic radiation from the first spectrum and the second spectrum. The electromagnetic radiation from the first spectrum is detected by image sensing array 410. The electromagnetic radiation from the second spectrum is detected by depth sensing pixel 420. In some embodiments, color filters are between image sensing array 410 and the incoming electromagnetic radiation. The color filters permit propagation of radiation of a particular waveband to permit a specific photodiode of image sensing array 410 to detect a specific color of electromagnetic radiation. In some embodiments where the second spectrum includes NIR radiation, color filters also transmit a sufficient amount of NIR radiation to permit detection of the NIR radiation by depth sensing pixel 420. In addition, NIR radiation penetrates deeper into silicon than visible radiation. Thus, sufficient NIR radiation is detected by depth sensing pixel 420 to distinguish detected NIR radiation from signal noise.

Figure 5:
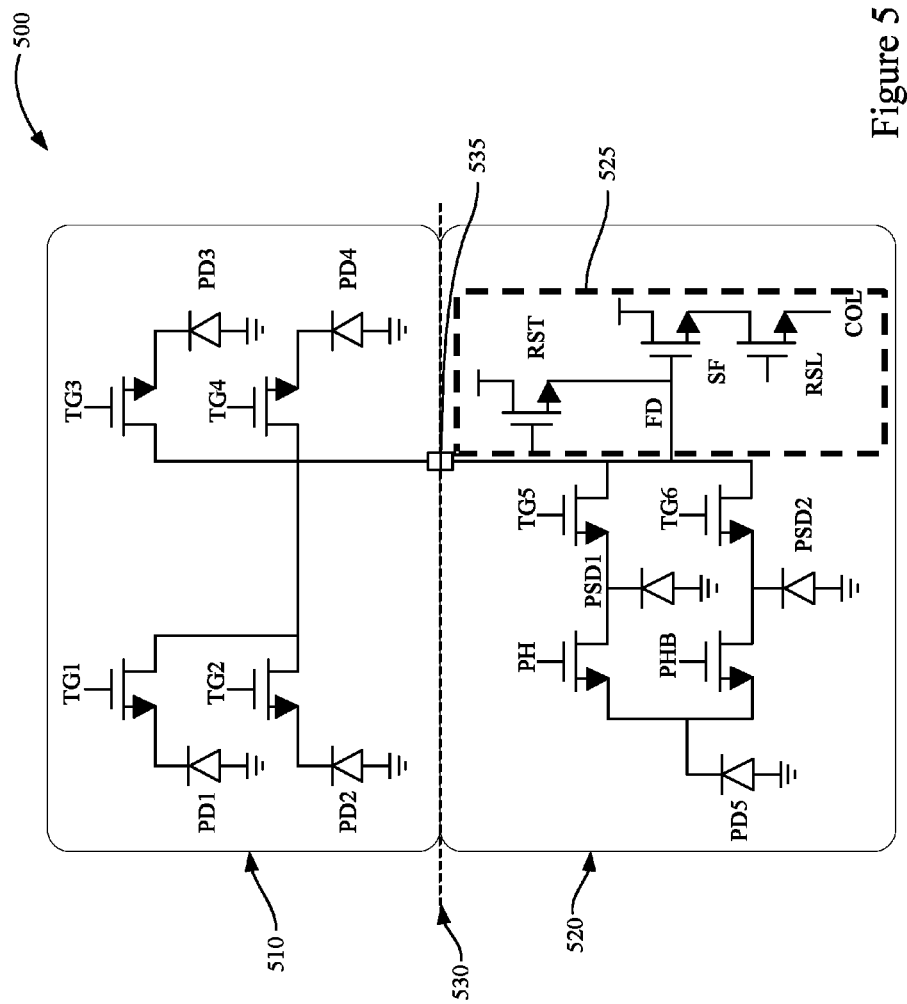
FIG. 5 is a schematic diagram of a composite pixel image sensor in accordance with some embodiments.

FIG. 5 is a schematic diagram of a composite pixel image sensor 500 in accordance with some embodiments. Composite pixel image sensor 500 is similar to composite pixel image sensor 400 (FIG. 4) and the same elements have a same reference number increased by 100. In comparison with composite pixel image sensor 400, image sensing array 510 does not include a separate readout circuit. Instead, readout circuit 525 is shared by both image sensing array 510 and depth sensing pixel 520. A connection 535 at bonding interface 530 is usable to transfer readout signals from image sensing array 510 to readout circuit 525. In comparison with composite pixel image sensor 400, a size of pixel image sensor 500 is reduced by using a single readout circuit 525.

In comparison with composite pixel image sensor 400, bonding interface 530 includes a hybrid bond in some embodiments. A hybrid bond is a combination of a fusion bond and a eutectic bond. For example, connection 535 is usable to form a eutectic bond, while portions of image sensing array 510 and depth sensing pixel 520 different from the connection are usable to form a fusion bond. In some embodiments, bonding interface 530 include a metallic layer, other than connection 535, between image sensing array 510 and depth sensing pixel 520. The metallic layer is electrically separated from connection 535 by a dielectric material. The dielectric material is able to be bonded to image sensing array 510 or depth sensing pixel 520 to form a fusion bond, in some embodiments. The metallic layer is able to form a larger eutectic bond area in comparison with embodiments which do not include the metallic layer.

Figure 6:
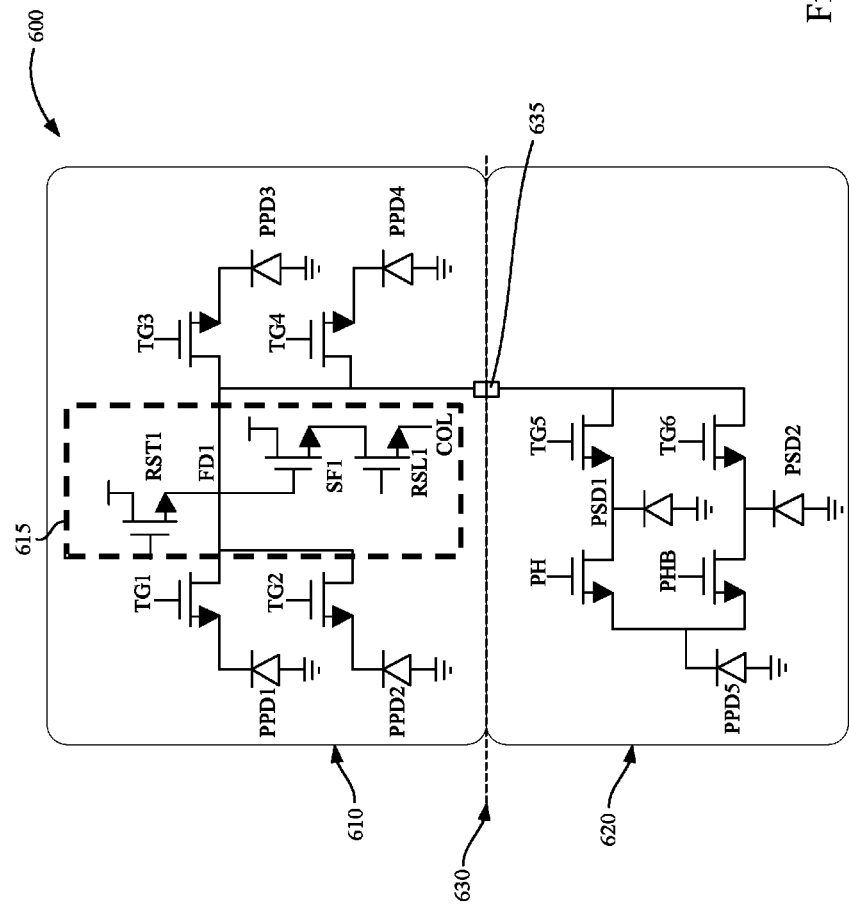
FIG. 6 is a schematic diagram of a composite pixel image sensor in accordance with some embodiments.

FIG. 6 is a schematic diagram of a composite pixel image sensor 600 in accordance with some embodiments. Composite pixel image sensor 600 is similar to composite pixel image sensor 400 (FIG. 4) and the same elements have a same reference number increased by 200. In comparison with composite pixel image sensor 400, depth sensing pixel 620 does not include a separate readout circuit. Instead, readout circuit 615 is shared by both image sensing array 610 and depth sensing pixel 620. A connection 635 at bonding interface 630 is usable to transfer readout signals from depth sensing pixel 620 to readout circuit 615. In comparison with composite pixel image sensor 400, a size of pixel image sensor 600 is reduced by using a single readout circuit 625.

In comparison with composite pixel image sensor 400, bonding interface 630 includes a hybrid bond in some embodiments. For example, connection 635 is usable to form a eutectic bond, while portions of image sensing array 610 and depth sensing pixel 620 different from the connection are usable to form a fusion bond. In some embodiments, bonding interface 630 include a metallic layer, other than connection 635, between image sensing array 610 and depth sensing pixel 620. The metallic layer is electrically separated from connection 635 by a dielectric material. The dielectric material is able to be bonded to image sensing array 610 or depth sensing pixel 620 to form a fusion bond, in some embodiments.

Figure 7:
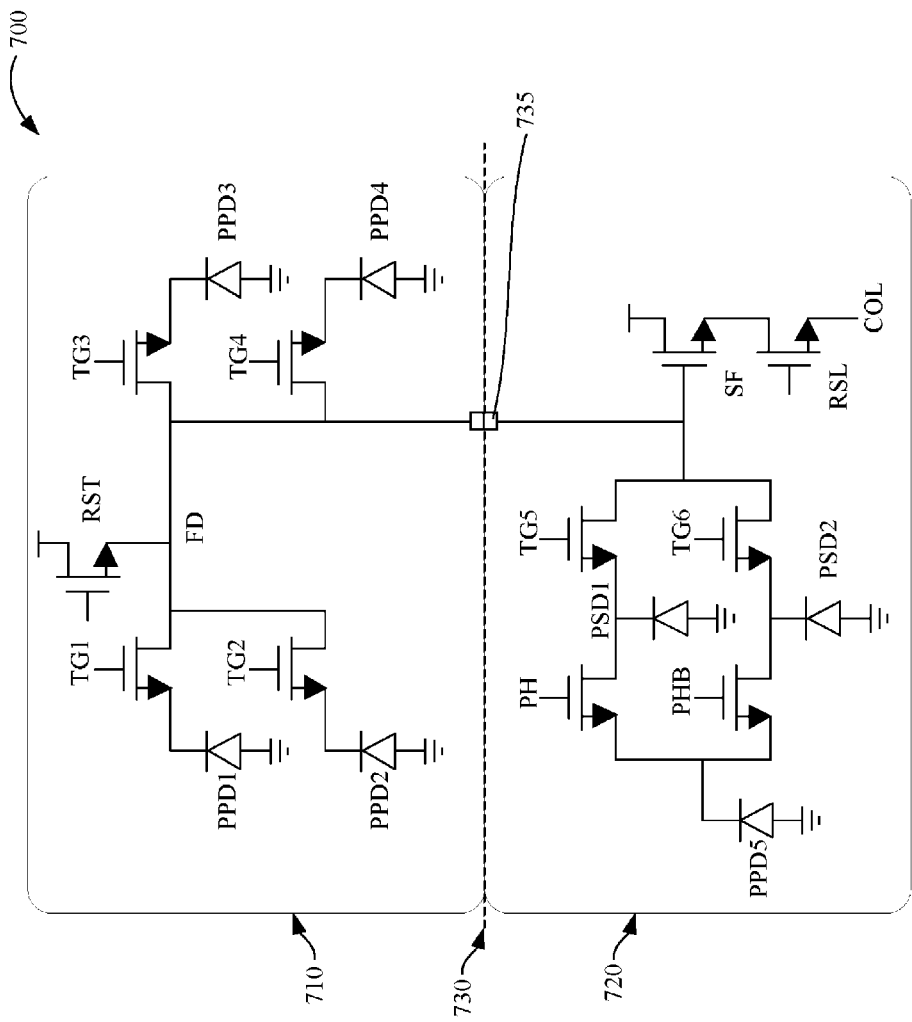
FIG. 7 is a schematic diagram of a composite pixel image sensor in accordance with some embodiments.

FIG. 7 is a schematic diagram of a composite pixel image sensor 700 in accordance with some embodiments. Composite pixel image sensor 700 is similar to composite pixel image sensor 400 (FIG. 4) and the same elements have a same reference number increased by 300. In comparison with composite pixel image sensor 400, portions of a readout circuit are split between image sensing array 710 and depth sensing pixel 720. Composite pixel image sensor 700 includes reset transistor RST as part of image sensing array 710, and source follower SF and row select transistor RSL as part of depth sensing pixel 720. In some embodiments, portions of the readout circuit are distributed differently between image sensing array 710 and depth sensing pixel 720. A connection 735 at bonding interface 730 is usable to transfer signals between different portions of the readout circuit. In comparison with composite pixel image sensor 400, a size of pixel image sensor 700 is reduced by using a single readout circuit 725. In addition, separating components of readout circuit 725 helps to further reduce a size of composite pixel image sensor 700 in comparison with composite pixel image sensor 400 because the components are able to be located in available space in either image sensing array 710 or depth sensing pixel 720.

In comparison with composite pixel image sensor 400, bonding interface 730 includes a hybrid bond in some embodiments. For example, connection 735 is usable to form a eutectic bond, while portions of image sensing array 710 and depth sensing pixel 720 different from the connection are usable to form a fusion bond. In some embodiments, bonding interface 730 include a metallic layer, other than connection 735, between image sensing array 710 and depth sensing pixel 720. The metallic layer is electrically separated from connection 735 by a dielectric material. The dielectric material is able to be bonded to image sensing array 710 or depth sensing pixel 720 to form a fusion bond, in some embodiments.

Figure 8:
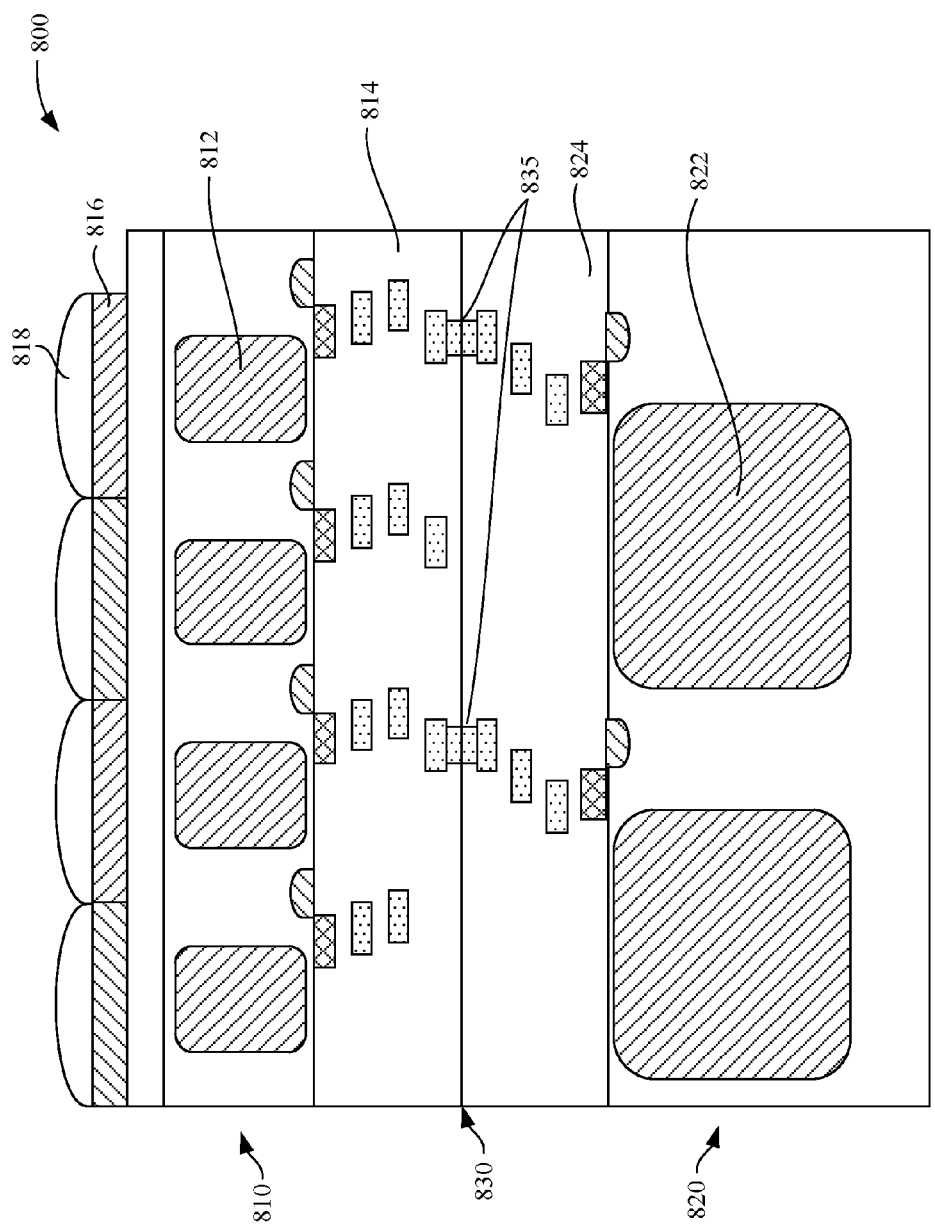
FIG. 8 is a cross-sectional view of a composite pixel image sensor in accordance with some embodiments.

FIG. 8 is a cross-sectional view of a composite pixel image sensor 800 in accordance with some embodiments. Composite pixel image sensor 800 includes an image sensing array 810 bonded to a depth sensing pixel array 820 at a bonding interface 830.

Image sensing array 810 includes an array of photodiodes 812. An interconnect structure 814 is coupled to the array of photodiodes 812. Interconnect structure 814 is used to couple various devices within image sensing array 810. In some embodiments, interconnect structure 814 includes conductive features separated a dielectric material such as silicon oxide. In some embodiments, the dielectric material is a material other than silicon oxide. A limited number of conductive features within interconnect structure 814 are depicted for simplicity. Color filters 816 are over the array of photodiodes 812. A lens array 818 is over color filters 816. Lens array 818 and color filters 816 are usable to focus a predefined spectrum of incoming electromagnetic radiation onto a corresponding photodiode 812 of the array of photodiodes.

Depth sensing pixel array 820 includes an array of depth sensing pixels 822. An interconnect structure 824 is over the array of depth sensing photodiodes 822. Interconnect structure 824 is used to couple various devices within depth sensing pixel array 820. Interconnect structure 824 is used to couple various devices within depth sensing pixel array 820. In some embodiments, interconnect structure 824 includes conductive features separated a dielectric material such as silicon oxide. In some embodiments, the dielectric material is a material other than silicon oxide. A limited number of conductive features within interconnect structure 824 are depicted for simplicity.

Bonding interface 830 includes connections 835 between interconnect structure 814 and interconnect structure 824. In some embodiments, connections 835 include conductive pads of interconnect structure 814 or interconnect structure 824. In some embodiments, connections 835 include conductive pillars extending from interconnect structure 814 or interconnect structure 824. Bonding interface 830 includes a hybrid bond. The hybrid bond includes a eutectic bond at connections 835 and a fusion bond between interconnect structure 814 and interconnect structure 824.

Composite pixel image sensor 800 includes image sensing array 810 as a back-side illuminated image sensor and depth sensing pixel array as a front-side illuminated image sensor. As a result, the fusion bond at bonding interface 830 is a silicon oxide-silicon oxide bond in some embodiments. In some embodiments, image sensing array 810 as a front-side illuminated image sensor and depth sensing pixel array as a front-side illuminated image sensor producing a silicon-silicon oxide fusion bond in some embodiments. In some embodiments, image sensing array 810 as a front-side illuminated image sensor and depth sensing pixel array as a back-side illuminated image sensor producing a silicon-silicon fusion bond in some embodiments. In some embodiments, image sensing array 810 as a back-side illuminated image sensor and depth sensing pixel array as a back-side illuminated image sensor producing a silicon oxide-silicon fusion bond in some embodiments.

In operation, in some embodiments, electromagnetic radiation is incident on lens array 818. The electromagnetic radiation propagates through color filters 816, which remove a portion of a visible spectrum from the incident electromagnetic radiation. Color filters 816 do not remove a substantial portion of NIR radiation from the incident electromagnetic radiation. A first portion of the electromagnetic radiation passed by color filters 816 is received the array of photodiodes 810. The array of photodiodes 810 converts the received electromagnetic radiation into an electrical charge. The electrical charge is transferred to a readout circuit (not shown) by interconnect structure 814. In some embodiments, image sensing array 810 includes a separate readout circuit from depth sensing pixel array 820. In some embodiments, image sensing array 810 shares the readout circuit with depth sensing pixel array 820. A second portion of the electromagnetic radiation passed by color filters is received by array of depth sensing photodiodes 822. The array of depth sensing photodiodes 822 converts the received electromagnetic radiation into an electrical charge. The electrical charge is transferred to a readout circuit by interconnect structure 824.

Figure 9:
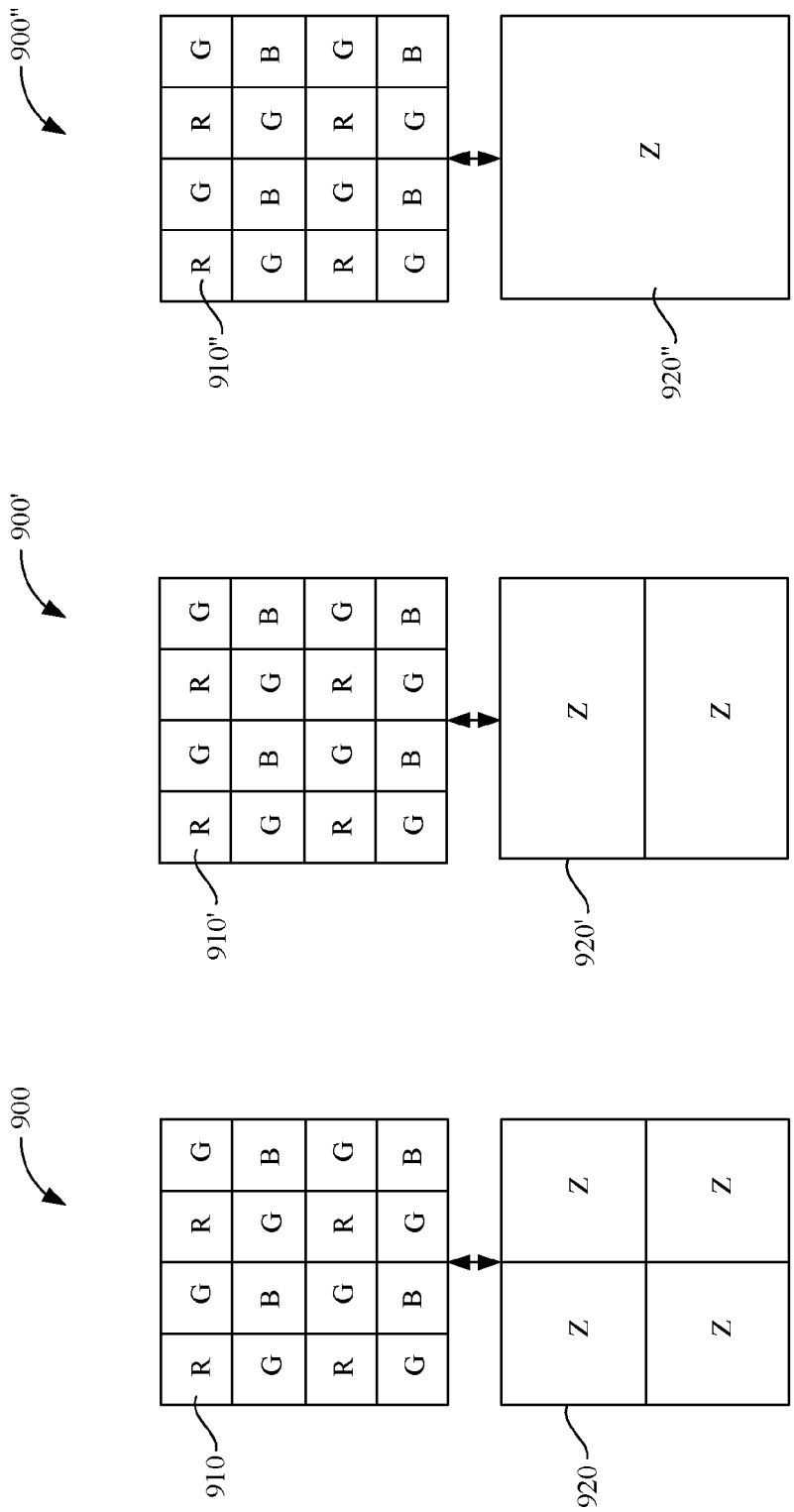
FIGS. 9A-9C are views of positional arrangement of a composite pixel image sensor in accordance with some embodiments.

FIG. 9A is a view of positional arrangement 900 of a composite pixel image sensor in accordance with some embodiments. Positional arrangement 900 includes a 4:1 ratio of image sensing pixels 910 to depth sensing pixels 920. Image sensing pixels 910 are arranged in a 4×4 array and depth sensing pixels 920 are arranged 2×2 array. Letters included in each of the image sensing pixels 910 identify an example color filter associated with that image sensing pixel. The letter 'R' indicates a red spectrum color filter; the letter 'B' indicates a blue spectrum color filter; and the letter 'G' indicates a green spectrum color filter. In some embodiments, image sensing pixels 910 are arranged in a Bayer filter pattern. In some embodiments, a single readout circuit is shared between four image sensing pixels 910 and one depth sensing pixel 920.

FIG. 9B is a view of positional arrangement 900' of a composite pixel image sensor in accordance with some embodiments. Positional arrangement 900' includes an 8:1 ratio of image sensing pixels 910' to depth sensing pixels 920'. Image sensing pixels 910' are arranged in a 4×4 array and depth sensing pixels 920' are arranged 2×1 array. In some embodiments, a single readout circuit is shared between eight image sensing pixels 910' and one depth sensing pixel 920'.

FIG. 9C is a view of positional arrangement 900" of a composite pixel image sensor in accordance with some embodiments. Positional arrangement 900" includes a 16:1 ratio of image sensing pixels 910" to depth sensing pixels 920". Image sensing pixels 910" are arranged in a 4×4 array and a single depth sensing pixels 920" is included. In some embodiments, a single readout circuit is shared between sixteen image sensing pixels 910" and the single depth sensing pixel 920".

Figure 10:
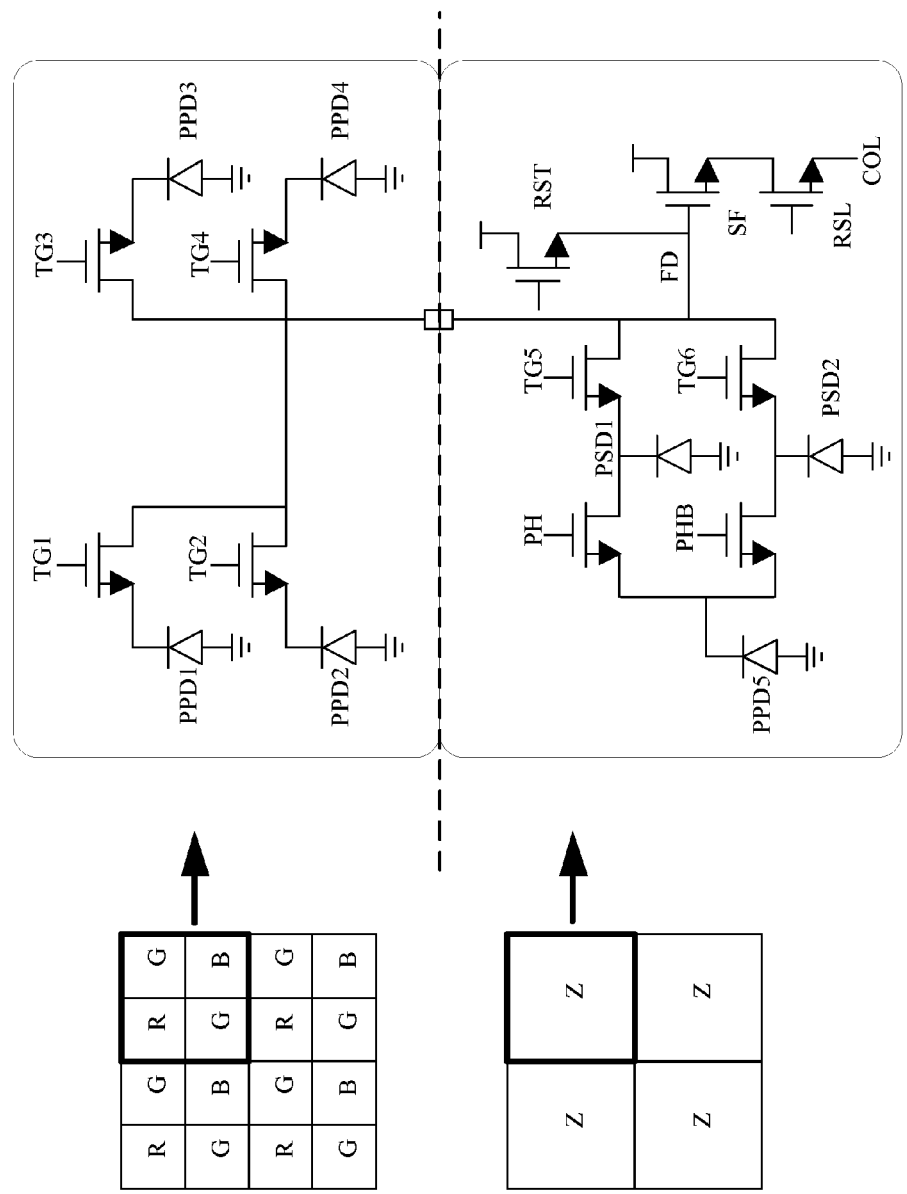
FIG. 10 is a combination view of a schematic diagram of a composite pixel image sensor and a positional arrangement of the composite pixel image sensor in accordance with some embodiments.

FIG. 10 is a combination view of a schematic diagram of a composite pixel image sensor and a positional arrangement of the composite pixel image sensor in accordance with some embodiments. The positional arrangement in FIG. 10 is the same as positional arrangement 900 (FIG. 9A). The schematic diagram of the composite pixel image sensor is the same as composite pixel image sensor 500 (FIG. 5). In the embodiment of FIG. 10, a single shared readout circuit is located in the depth sensing pixel. In some embodiments, separate readout circuits are located in the depth sensing pixel and the image sensing array. In some embodiments, a single shared readout circuit is located in the image sensing array. In some embodiments, portions of a shared readout circuit are located in each of the depth sensing pixel and the image sensing array.

Figure 11:
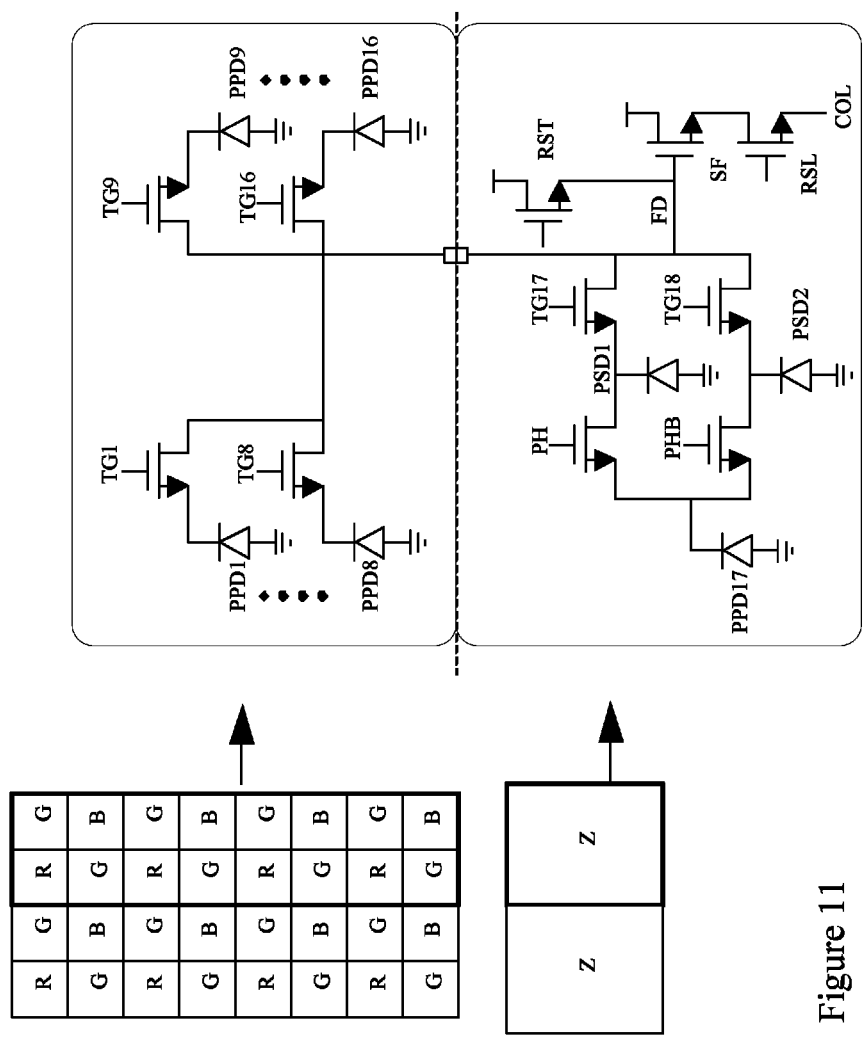
FIG. 11 is a combination view of a schematic diagram of a composite pixel image sensor and a positional arrangement of the composite pixel image sensor in accordance with some embodiments.

FIG. 11 is a combination view of a schematic diagram of a composite pixel image sensor and a positional arrangement of the composite pixel image sensor in accordance with some embodiments. The positional arrangement in FIG. 11 includes a 16:1 ratio of image sensing pixels to depth sensing pixels. The schematic diagram of the composite pixel image sensor is the same as composite pixel image sensor 500 (FIG. 5). In comparison with composite pixel image sensor 500, the image sensing array of FIG. 11 includes an 8×2 array of image sensing pixels. In the embodiment of FIG. 11, a single shared readout circuit is located in the depth sensing pixel. In some embodiments, separate readout circuits are located in the depth sensing pixel and the image sensing array. In some embodiments, a single shared readout circuit is located in the image sensing array. In some embodiments, portions of a shared readout circuit are located in each of the depth sensing pixel and the image sensing array.

Figure 12:
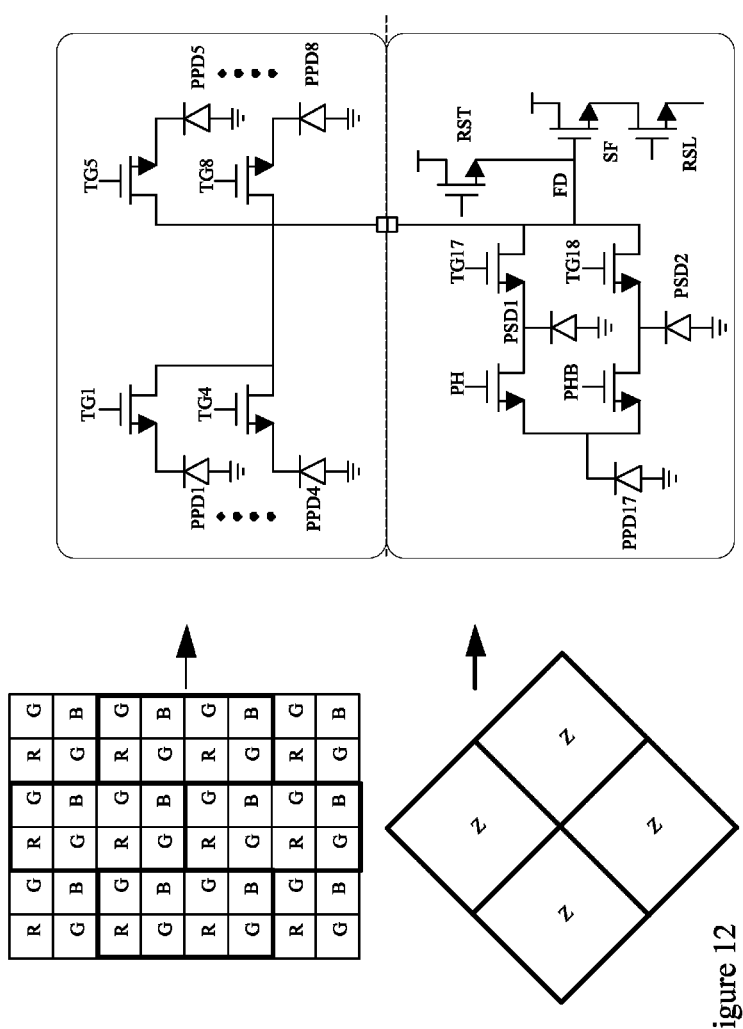
FIG. 12 is a combination view of a schematic diagram of a composite pixel image sensor and a positional arrangement of the composite pixel image sensor in accordance with some embodiments.

FIG. 12 is a combination view of a schematic diagram of a composite pixel image sensor and a positional arrangement of the composite pixel image sensor in accordance with some embodiments. The positional arrangement in FIG. 12 includes an 8:1 ratio of image sensing pixels to depth sensing pixels. Groupings of the image sensing pixels in FIG. 12 are arranged in a staggered pattern. In some embodiments, the staggered pattern is called a subway tile pattern. The schematic diagram of the composite pixel image sensor is similar to composite pixel image sensor 500 (FIG. 5). In comparison with composite pixel image sensor 500, the image sensing array of FIG. 12 includes an 8×2 array of image sensing pixels. In the embodiment of FIG. 12, a single shared readout circuit is located in the depth sensing pixel. In some embodiments, separate readout circuits are located in the depth sensing pixel and the image sensing array. In some embodiments, a single shared readout circuit is located in the image sensing array. In some embodiments, portions of a shared readout circuit are located in each of the depth sensing pixel and the image sensing array.

The positional arrangements of FIGS. 10-12 include rectangular patterns of image sensing pixels. In some embodiments, other patterns or pattern shapes are used to group the image sensing pixels with a corresponding depth sensing pixel.

Figure 13:
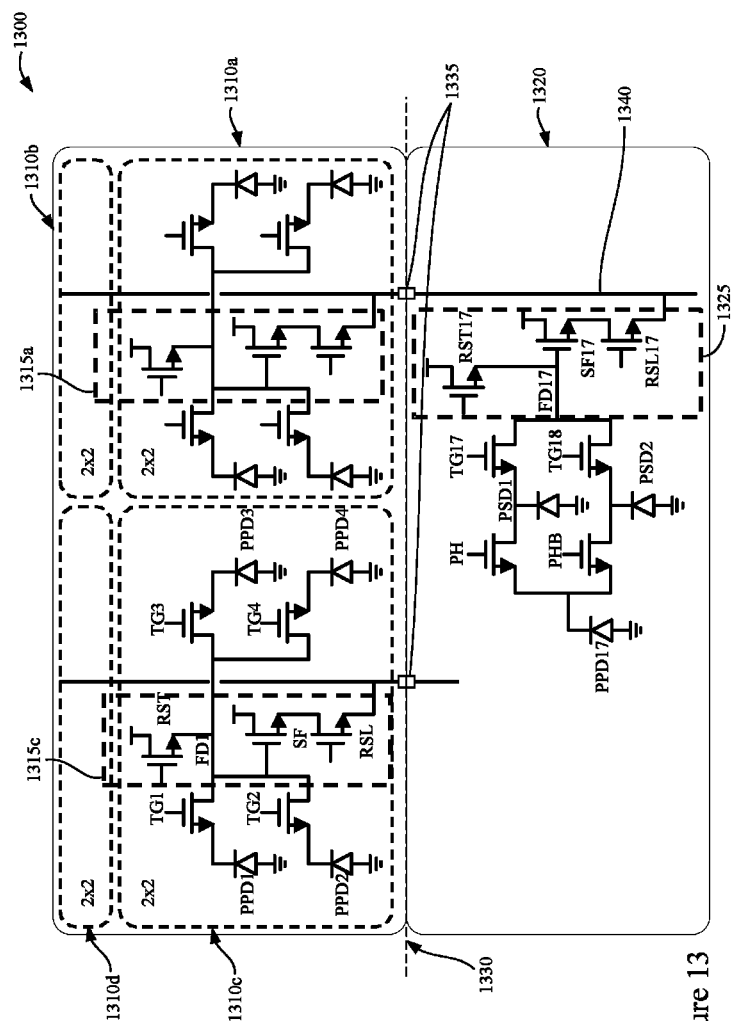
FIG. 13 is a schematic diagram of a composite pixel image sensor in accordance with some embodiments.

FIG. 13 is a schematic diagram of a composite pixel image sensor 1300 in accordance with some embodiments. Composite pixel image sensor 1300 includes a plurality of image sensing arrays 1310a, 1310b, 1310c and 1310d. Image sensing arrays 1310a, 1310b, 1310c and 1310d are arranged in a planar fashion. A depth sensing pixel 1320 is bonded to a surface of image sensing arrays 1310a, 1310b, 1310c and 1310d opposite a side of the image sensing arrays configured to receive incident electromagnetic radiation. Depth sensing pixel 1320 is bonded to image sensing arrays 1310a, 1310b, 1310c and 1310d at bonding interface 1330.

Each image sensing array 1310a, 1310b, 1310c and 1310d is the same as image sensing array 410 (FIG. 4). Each image sensing array 1310a, 1310b, 1310c and 1310d includes a 2×2 array of image sensing pixels. In some embodiments, at least one image sensing array 1310a, 1310b, 1310c or 1310d includes an array size other than 2×2. In some embodiments, at least one image sensing array 1310a, 1310b, 1310c or 1310d is arranged in a Bayer filter arrangement. Each image sensing array 1310a, 1310b, 1310c and 1310d includes a readout circuit, e.g., readout circuit 1315a and readout circuit 1315c. Readout circuits of a column of image sensing arrays, e.g., image sensing arrays 1310a and 1310b, are coupled to a single readout line 1340.

Depth sensing pixel 1320 is to the same as depth sensing pixel 100 (FIG. 1). Depth sensing pixel 1320 includes a readout circuit 1325. Readout circuit 1325 is coupled to readout line 1340.

Bonding interface 1330 includes connections 1335 which couple a portion of readout line 1340 in the image sensing arrays 1310a, 1310b, 1310c and 1310d to a portion of the readout line in depth sensing pixel 1320. Bonding interface 1330 includes a hybrid bond.

In operation, in some embodiments, each image sensor array 1310a, 1310b, 1310c and 1310d receive a portion of incident electromagnetic radiation and converts the received electromagnetic radiation into an electrical charge. Depth sensing pixel 1320 also receives a portion of the incident electromagnetic radiation and converts the recited electromagnetic radiation into an electrical charge. The electrical charges of each image sensing array, e.g., image sensing array 1310a and image sensing array 1310b, coupled to readout line 1340 are sequentially read out to external circuits. Depth sensing pixel 1320 coupled to readout line 1340 is also read out sequentially with image sensing arrays coupled to the readout line.

In comparison with composite pixel image sensor 400, composite pixel image sensor 1300 reduces a number of external circuits used to process signals read out from the image sensing arrays and the depth sensing pixel. In addition, composite pixel image sensor 1300 multiplexes the readout signal in a time domain. In comparison, composite pixel image sensor 400 does not multiplex the readout signals in a time domain.

Figure 14:
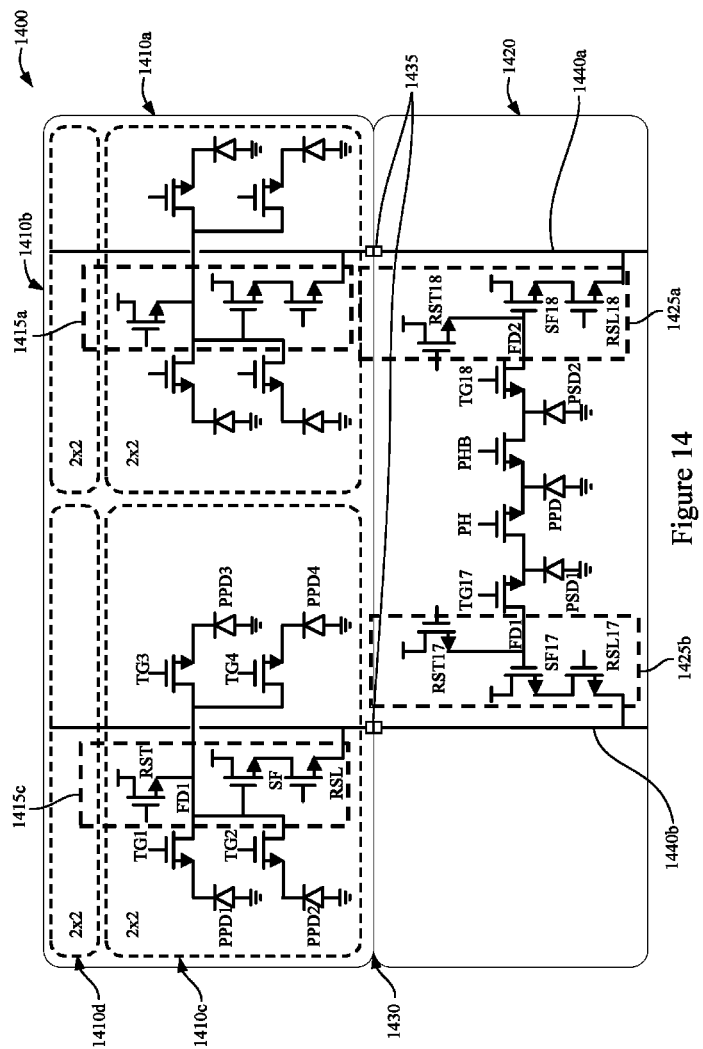
FIG. 14 is a schematic diagram of a composite pixel image sensor in accordance with some embodiments.

FIG. 14 is a schematic diagram of a composite pixel image sensor 1400 in accordance with some embodiments. Composite pixel image sensor 1400 includes a plurality of image sensing arrays 1410a, 1410b, 1410c and 1410d. Image sensing arrays 1410a, 1410b, 1410c and 1410d are arranged in a planar fashion. A depth sensing pixel 1420 is bonded to a surface of image sensing arrays 1410a, 1410b, 1410c and 1410d opposite a side of the image sensing arrays configured to receive incident electromagnetic radiation. Depth sensing pixel 1420 is bonded to image sensing arrays 1410a, 1410b, 1410c and 1410d at bonding interface 1430.

Each image sensing array 1410a, 1410b, 1410c and 1410d is to the same as image sensing array 410 (FIG. 4). Each image sensing array 1410a, 1410b, 1410c and 1410d includes a 2×2 array of image sensing pixels. In some embodiments, at least one image sensing array 1410a, 1410b, 1410c or 1410d includes an array size other than 2×2. In some embodiments, at least one image sensing array 1410a, 1410b, 1410c or 1410d is arranged in a Bayer filter arrangement. Each image sensing array 1410a, 1410b, 1410c and 1410d includes a readout circuit, e.g., readout circuit 1415a and readout circuit 1415c. Image sensing arrays 1410a and 1410b are coupled to a single readout line 1440a. Image sensing arrays 1410c and 1410d are coupled to a single readout line 1440b.

In comparison with depth sensing pixel 1320 (FIG. 13), depth sensing pixel 1420 includes two readout circuits 1425a and 1425b. Readout circuit 1425a is coupled to readout line 1440a. Readout circuit 1425b is coupled to readout line 1440b.

Bonding interface 1430 includes connections 1435. One connection 1435 couples a portion of readout line 1440a in the image sensing arrays 1410a and 1410b to a portion of the readout line in depth sensing pixel 1420. Another connection 1435 couples a portion of readout line 1440b in the image sensing arrays 1410c and 1410d to a portion of the readout line in depth sensing pixel 1420. Bonding interface 1430 includes a hybrid bond.

In operation, in some embodiments, each image sensor array 1410a, 1410b, 1410c and 1410d receives a portion of incident electromagnetic radiation and converts the received electromagnetic radiation into an electrical charge. Depth sensing pixel 1420 also receives a portion of the incident electromagnetic radiation and converts the recited electromagnetic radiation into an electrical charge. The electrical charges of image sensing array 1410a and image sensing array 1410b, coupled to readout line 1440a are sequentially read out to external circuits. A portion of the electrical charge of depth sensing pixel 1420 transferred to second photo storage diode PSD2 is read out to readout line 1440a out sequentially with image sensing arrays coupled to the readout line. The electrical charges of image sensing array 1410c and image sensing array 1410d, coupled to readout line 1440b are sequentially read out to external circuits. A portion of the electrical charge of depth sensing pixel 1420 transferred to first photo storage diode PSD1 is read out to readout line 1440b out sequentially with image sensing arrays coupled to the readout line.

In comparison with composite pixel image sensor 1300, composite pixel image sensor 1400 reduces a number of depth sensing pixels which reduces an overall size of the composite pixel image sensor. Composite pixel image sensor 1400 reduces a resolution of depth sensing pixels in comparison with composite pixel image sensor 1400.

Figure 15:
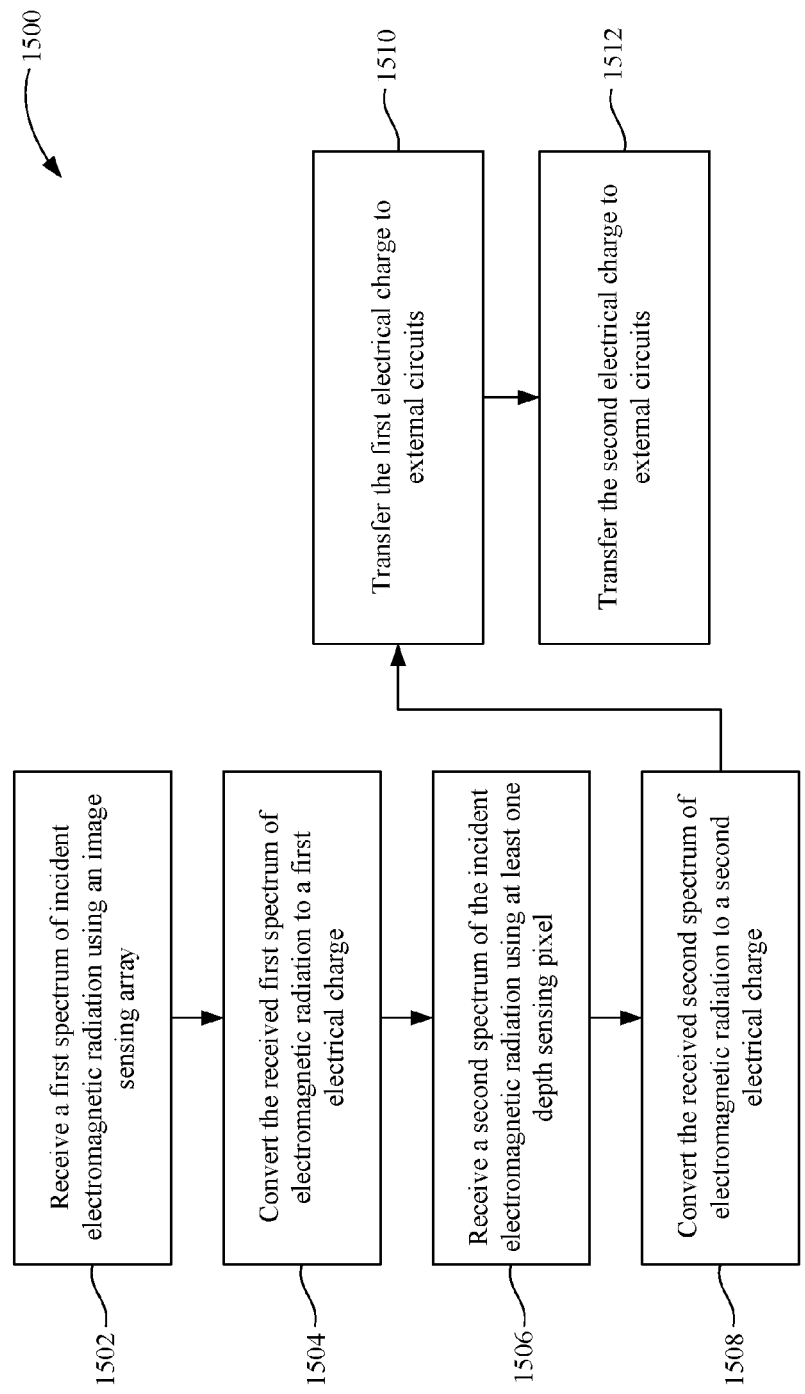
FIG. 15 is a flow chart of a method of using a composite pixel image sensor in accordance with some embodiments.

FIG. 15 is a flow chart of a method 1500 of using a composite pixel image sensor in accordance with some embodiments. In operation 1502, a first spectrum of incident electromagnetic radiation is received by an image sensing array. In some embodiments, the first spectrum is includes visible electromagnetic radiation. In some embodiments, the image sensing array is to the same as image sensing array 410 (FIG. 4), image sensing array 510 (FIG. 5), image sensing array 610 (FIG. 6), image sensing array 710 (FIG. 7), image sensing array 1310a-1310d (FIG. 13) or image sensing array 1410a-1410d (FIG. 14).

The received first spectrum of electromagnetic radiation is configured to a first electrical charge in operation 1504. In some embodiments, the received electromagnetic radiation is converted to the first electrical charge using a photodiode, e.g., a pinned photodiode.

In operation 1504, a second spectrum of incident electromagnetic radiation is received by at least one depth sensing pixel. The second spectrum is different from the first spectrum. In some embodiments, the second spectrum is includes NIR electromagnetic radiation. In some embodiments, the depth sensing pixel is the same as depth sensing pixel 100 (FIG. 1), depth sensing pixel 420 (FIG. 4), depth sensing pixel 520 (FIG. 5), depth sensing pixel 620 (FIG. 6), depth sensing pixel 720 (FIG. 7), depth sensing pixel 1320 (FIG. 13) or depth sensing pixel 1420 (FIG. 14).

The received second spectrum of electromagnetic radiation is configured to a second electrical charge in operation 1508. In some embodiments, the received electromagnetic radiation is converted to the second electrical charge using a photodiode, e.g., a pinned photodiode.

In operation 1510, the first electrical charge is transferred to external circuits. The first electrical charge is transferred to the external circuits through a readout circuit. In some embodiments, the readout circuit is located in the image sensing array. In some embodiments, the readout circuit is located in the at least one depth sensing pixel. In some embodiments, a portion of the readout circuit is located in the image sensing array and another portion of the readout circuit is located in the at least one depth sensing pixel. In some embodiments, the first electrical charge is transferred to the external circuits along a readout line coupled to a separate image sensing array. In some embodiments, the first electrical charge is transferred to the external circuit in a time multiplexed manner.

In operation 1520, the second electrical charge is transferred to the external circuits. In some embodiments, operation 1520 is to the same as method 200. The second electrical charge is transferred to the external circuits through a readout circuit. In some embodiments, the readout circuit for transferring the second electrical charge is a same readout circuit as that used to transfer the first electrical charge. In some embodiments, the readout circuit for transferring the second electrical charge is different from a readout circuit used to transfer the first electrical charge. In some embodiments, the readout circuit is located in the image sensing array. In some embodiments, the readout circuit is located in the at least one depth sensing pixel. In some embodiments, a portion of the readout circuit is located in the image sensing array and another portion of the readout circuit is located in the at least one depth sensing pixel. In some embodiments, the second electrical charge is transferred to the external circuits along a readout line coupled to multiple image sensing arrays. In some embodiments, the second electrical charge is transferred to the external circuits along a first readout line in a first readout operation and along a separate readout line in a subsequent readout operation. In some embodiments, the second electrical charge is transferred to the external circuits in a time multiplexed manner.

In some embodiments, an order of the operations of method 1500 is altered. In some embodiments, at least one operation of method 1500 is combined with at least another operation of the method. In some embodiments, additional operations are included in method 1500.

Figure 16:
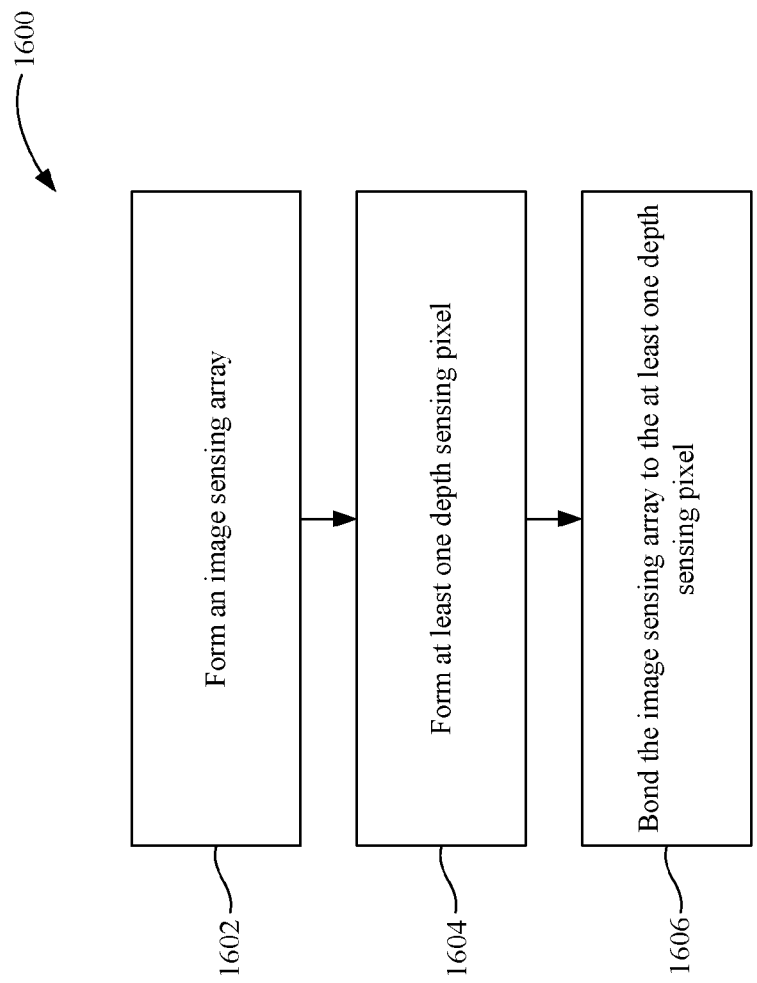
FIG. 16 is a flow chart of a method of making a composite pixel image sensor in accordance with some embodiments.

FIG. 16 is a flow chart of a method 1600 of making a composite pixel image sensor in accordance with some embodiments. In operation 1602, an image sensing array is formed. In some embodiments, the image sensing array is a front-side illuminated image sensor. In some embodiments, the image sensing array is a back-side illuminated image sensor. In some embodiments, the image sensing array is to the same as image sensing array 410 (FIG. 4), image sensing array 510 (FIG. 5), image sensing array 610 (FIG. 6), image sensing array 710 (FIG. 7), image sensing array 810 (FIG. 8), image sensing array 1310a-1310d (FIG. 13) or image sensing array 1410a-1410d (FIG. 14).

In operation 1604, at least one depth sensing pixel is formed. In some embodiments, the depth sensing pixel is a front-side illuminated image sensor. In some embodiments, the depth sensing pixel is a back-side illuminated image sensor. In some embodiments, the image sensing array is to the same as depth sensing pixel 100 (FIG. 1), depth sensing pixel 420 (FIG. 4), depth sensing pixel 520 (FIG. 5), depth sensing pixel 620 (FIG. 6), depth sensing pixel 720 (FIG. 7), depth sensing pixel array 820 (FIG. 8), depth sensing pixel 1320 (FIG. 13) or depth sensing pixel 1420 (FIG. 14).

The image sensing array is bonded to the at least one depth sensing pixel in operation 1606. In some embodiments, the image sensing array is bonded to the at least one depth sensing pixel using a fusion bond. In some embodiments, the image sensing array is bonded to the at least one depth sensing pixel using a eutectic bond. In some embodiments, the image sensing array is bonded to the at least one depth sensing pixel using a hybrid bond.

In some embodiments, an order of the operations of method 1600 is altered. In some embodiments, at least one operation of method 1600 is combined with at least another operation of the method. In some embodiments, additional operations are included in method 1600.

One aspect of this description relates to a method of making a composite pixel image sensor. The method includes forming an image sensing array; and forming a depth sensing pixel. The depth sensing pixel includes a depth sensing photodiode; a first photo storage diode; and a first transistor configured to selectively couple the depth sensing photodiode to the first photo storage diode. The depth sensing pixel further includes a second photo storage diode different from the first photo storage device; and a second transistor configured to selectively couple the depth sensing photodiode to the second photo storage device. The depth sensing pixel further includes a first transfer gate configured to selectively couple the first photo storage diode to a first output node. The depth sensing pixel further includes a second transfer gate configured to selectively couple the second photo storage diode to a second output node. The method further includes bonding the image sensing array to the depth sensing pixel.

Another aspect of this description relates to a method of making a composite pixel image sensor. The method includes forming a depth sensing pixel having a first photodiode. The method further includes forming an image sensing array having a plurality of second photodiodes; and forming a readout circuit. The method further includes bonding the image sensing array to the depth sensing pixel. The readout circuit is electrically coupled to both the depth sensing pixel and the image sensing pixel following the bonding.

Still another aspect of this description relates to a method of making a composite pixel image sensor. The method includes forming a depth sensing pixel having a first photodiode. The method further includes forming a plurality of image sensing arrays, wherein each image sensing array of the plurality of image sensing arrays comprises a plurality of second photodiodes. The method further includes bonding at least two image sensing arrays of the plurality of image sensing arrays to the depth sensing pixel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a composite pixel image sensor, the method comprising:
   forming an image sensing array;
   forming a depth sensing pixel, the depth sensing pixel comprising:
      a depth sensing photodiode;
      a first photo storage diode;
      a first transistor configured to selectively couple the depth sensing photodiode to the first photo storage device;
      a second photo storage diode different from the first photo storage diode;
      a second transistor configured to selectively couple the depth sensing photodiode to the second photo storage device;
      a first transfer gate configured to selectively couple the first photo storage diode to a first output node; and
      a second transfer gate configured to selectively couple the second photo storage diode to a second output node; and
   bonding the image sensing array to the depth sensing pixel.

2. The method of claim 1, wherein bonding the image sensing array to the depth sensing pixel comprises forming a hybrid bond.

3. The method of claim 1, wherein forming the image sensing array comprises forming a readout circuit, wherein the readout circuit is coupled to the depth sensing circuit.

4. A method of making a composite pixel image sensor, the method comprising:
- forming a depth sensing pixel having a first photodiode;
- forming an image sensing array having a plurality of second photodiodes;
- forming a readout circuit; and
- bonding the image sensing array to the depth sensing pixel, wherein the readout circuit is electrically coupled to both the depth sensing pixel and the image sensing pixel following the bonding.

5. The method of claim 4, wherein forming the readout circuit comprises forming the readout circuit electrically coupled to the depth sensing pixel prior to the bonding.

6. The method of claim 4, wherein forming the readout circuit comprises forming the readout circuit electrically coupled to the image sensing array prior to the bonding.

7. The method of claim 4, wherein forming the readout circuit comprises forming the readout circuit between second photodiodes of the plurality of second photodiodes.

8. The method of claim 4, wherein forming the readout circuit comprises:
- forming a first component of the readout circuit electrically coupled to the depth sensing circuit prior to the bonding; and
- forming a second component of the readout circuit electrically coupled to the image sensing array prior to the bonding.

9. The method of claim 8, wherein bonding the image sensing array to the depth sensing pixel comprises electrically coupling the first component to the second component.

10. The method of claim 4, wherein bonding the image sensing array to the depth sensing pixel comprises bonding a plurality of image sensing arrays to the depth sensing pixel.

11. The method of claim 4, wherein bonding the image sensing array to the depth sensing pixel comprises forming a hybrid bond.

12. The method of claim 4, wherein bonding the image sensing array to the depth sensing pixel comprises forming a fusion bond or a eutectic bond.

13. A method of making a composite pixel image sensor, the method comprising:
- forming a depth sensing pixel having a first photodiode;
- forming a plurality of image sensing arrays, wherein each image sensing array of the plurality of image sensing arrays comprises a plurality of second photodiodes; and
- bonding at least two image sensing arrays of the plurality of image sensing arrays to the depth sensing pixel.

14. The method of claim 13, wherein bonding the at least two image sensing arrays of the plurality of image sensing arrays to the depth sensing pixel comprises:
- electrically coupling a first image sensing array of the at least two image sensing arrays to a first end of the depth sensing pixel; and
- electrically coupling a second image sensing array of the at least two image sensing arrays to a second end of the depth sensing pixel.

15. The method of claim 14, wherein forming the depth sensing pixel comprises:
- forming a first readout circuit in the depth sensing pixel, wherein the first readout circuit is electrically coupled to the first image sensing array by the bonding; and
- forming a second readout circuit in the depth sensing pixel, wherein the second readout circuit is electrically coupled to the second image sensing array by the bonding.

16. The method of claim 13, wherein forming the plurality of image sensing arrays comprises forming a readout circuit in each image sensing array of the plurality of image sensing arrays.

17. The method of claim 13, further comprising bonding a first image sensing array of the plurality of image sensing arrays to a second image sensing array of the plurality of image sensing arrays, wherein the first image sensing array is between the second image sensing array and the depth sensing pixel.

18. The method of claim 13, wherein forming the depth sensing pixel comprises forming the first photodiode having a larger area than each second diode of the plurality of second diodes.

19. The method of claim 13, wherein bonding the image sensing array to the depth sensing pixel comprises forming a hybrid bond.

20. The method of claim 13, wherein bonding the image sensing array to the depth sensing pixel comprises forming a fusion bond or a eutectic bond.

* * * * *